US012647107B2

(12) United States Patent
Bellaouar et al.

(10) Patent No.: US 12,647,107 B2
(45) Date of Patent: Jun. 2, 2026

(54) SHARED PHASE SHIFTER RADIO ARCHITECTURE

(71) Applicant: QUALCOMM Incorporated, San Diego, CA (US)

(72) Inventors: Abdellatif Bellaouar, Richardson, TX (US); Chirag Dipak Patel, San Diego, CA (US); Kevin Hsi-Huai Wang, San Diego, CA (US); Rajagopalan Rangarajan, San Diego, CA (US); Gurkanwal Singh Sahota, Rancho Santa Fe, CA (US); Arul Balasubramaniyan, Plano, TX (US)

(73) Assignee: QUALCOMM Incorporated, San Diego, CA (US)

( * ) Notice: Subject to any disclaimer, the term of this patent is extended or adjusted under 35 U.S.C. 154(b) by 397 days.

(21) Appl. No.: 18/340,239

(22) Filed: Jun. 23, 2023

(65) Prior Publication Data

US 2024/0429906 A1 Dec. 26, 2024

(51) Int. Cl.
| | |
|---|---|
| *H03K 5/01* | (2006.01) |
| *H03G 3/30* | (2006.01) |
| *H04B 7/08* | (2006.01) |
| *H03K 5/00* | (2006.01) |

(52) U.S. Cl.
CPC ............. *H03K 5/01* (2013.01); *H03G 3/3036* (2013.01); *H04B 7/0868* (2013.01); *H03G 2201/103* (2013.01); *H03K 2005/00286* (2013.01)

(58) Field of Classification Search
None
See application file for complete search history.

(56) References Cited

U.S. PATENT DOCUMENTS

| | | | | |
|---|---|---|---|---|
| 9,285,461 | B2 * | 3/2016 | Swirhun | ................. G01S 7/026 |
| 10,574,287 | B1 * | 2/2020 | Thoppay Egambaram | ................. |
| | | | | H03F 3/245 |
| 10,778,190 | B2 | 9/2020 | Vaesen et al. | |
| 11,183,973 | B1 * | 11/2021 | Jain | ........................ H03D 7/165 |

(Continued)

FOREIGN PATENT DOCUMENTS

| | | |
|---|---|---|
| JP | 2018078390 A | 5/2018 |
| WO | 2023049623 A1 | 3/2023 |

OTHER PUBLICATIONS

International Search Report and Written Opinion—PCT/US2024/033506—ISA/EPO—Oct. 16, 2024.

(Continued)

*Primary Examiner* — Cassandra F Cox
(74) *Attorney, Agent, or Firm* — Smith Tempel Blaha LLC/Qualcomm

(57) ABSTRACT

A phase shifter for a millimeter wave (mmW) communication system including an in phase variable gain amplifier (I VGA) and a quadrature VGA (Q VGA) configured to receive radio frequency (RF) signals, the I VGA and the Q VGA configured to provide a selectable output to primary sides of first and second electromagnetic (EM) elements, respectively, the first EM element configured to provide a single-ended I output and the second EM element configured to provide a single-ended Q output, and a hybrid quadrature generator (HQG) configured to receive the single-ended I output of the first EM element and the single-ended Q output of the second EM element, the HQG configured to provide a combined signal at a desired phase.

21 Claims, 20 Drawing Sheets

(56) References Cited

U.S. PATENT DOCUMENTS

| | | | |
|---|---|---|---|
| 12,074,575 B2* | 8/2024 | Elsayed | H03G 3/002 |
| 2020/0091605 A1 | 3/2020 | Ngai et al. | |
| 2020/0382088 A1* | 12/2020 | Saha | H03H 7/21 |
| 2024/0322795 A1* | 9/2024 | Hassan | H03F 3/24 |

OTHER PUBLICATIONS

Koh K-J., et al., "0.13-µm CMOS Phase Shifters for X-, K u-, and K-Band Phased Arrays", IEEE, Journal of Solid-state Circuits, IEEE, USA, vol. 42, No. 11, Nov. 30, 2007, pp. 2535-2546, XP011195886, figure 1.

* cited by examiner

1000

1010
1020

RX/TX Element 1
RX/TX Element 2

PA  1012
LNA1
LNA1
1022  PA 1014
1024

RX I/Q
VGA2
1015
1025
RX I/Q
VGA1

Connection Network

1050

1052
1062

TX I/Q
VGA2
TX I/Q
VGA1

1016
1075
1026

Switching Network

Q
I

Hybrid IQ Generator

1074

1082

TX_in   RX_out

1700

START

PROVIDE RECEIVE SIGNAL TO VARIABLE GAIN AMPLIFIERS
1702

STEER CURRENT THROUGH I VGA AND Q VGA TO GENERATE PHASE
1704

COMBINE I AND Q PHASE SIGNALS TO GENERATE A SINGLE ENDED COMBINED OUTPUT AT DESIRED PHASE
1706

END

1800

MEANS FOR PROVIDING RECEIVE SIGNAL TO VARIABLE GAIN AMPLIFIERS

1802

MEANS FOR STEERING CURRENT THROUGH I VGA AND Q VGA TO GENERATE PHASE

1804

MEANS FOR COMBINING I AND Q PHASE SIGNALS TO GENERATE A SINGLE ENDED COMBINED OUTPUT AT DESIRED PHASE

1806

SHARED PHASE SHIFTER RADIO ARCHITECTURE

FIELD

The present disclosure relates generally to electronics, and more specifically to phase shifters in a transceiver.

BACKGROUND

Wireless communication devices and technologies are becoming ever more prevalent, as are communication devices that operate at millimeter-wave (mmW) and sub-terahertz (subTHz) frequencies. Wireless communication devices generally transmit and/or receive communication signals. In a radio frequency (RF) transceiver, a communication signal is typically amplified and transmitted by a transmit section and a received communication signal is amplified and processed by a receive section. A transceiver for communication in 5G and 6G applications may communicate using millimeter wave (mmW) frequency signals and/or sub-THz frequencies and may use what is referred to as a zero intermediate frequency (ZIF) architecture or a low-IF architecture.

Transceivers used in 5G communication systems may use what is referred to as beamforming to increase system capacity. Beamforming generally uses individual transmit and receive elements where a phase shifter alters the phase of the signal. Typically, many such elements and phase shifters are implemented in such a system. Typically, each TX/RX element uses two phase shifters, one for transmit and one for receive.

A typical system architecture may implement four phase shifters for two adjacent TX/RX elements. Each phase shifter comprises a vector modulator, a hybrid quadrature generator (HQG) and a combining circuit, and as a result occupies large area on a circuit. Generally, the phase shifter also has a minimum gain so that following stages do not contribute to the system noise figure (NF). A typical phase shifter NF may be on the order of 11-16 dB at frequencies in the 24-48 GHz range.

Therefore, it would be desirable to minimize the number of phase shifters in such systems.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides a phase shifter for a millimeter wave (mmW) communication system including an in phase variable gain amplifier (I VGA) and a quadrature VGA (Q VGA) configured to receive radio frequency (RF) signals, the I VGA and the Q VGA configured to provide a selectable output to primary sides of first and second electromagnetic (EM) elements, respectively, the first EM element configured to provide a single-ended I output and the second EM element configured to provide a single-ended Q output, and a hybrid quadrature generator (HQG) configured to receive the single-ended I output of the first EM element and the single-ended Q output of the second EM element, the HQG configured to provide a combined signal at a desired phase.

Another aspect of the disclosure provides a method for phase shifting signals including providing radio frequency (RF) receive signals to an in phase variable gain amplifier (I VGA) and to a quadrature variable gain amplifier (Q VGA), steering current through the I VGA and the Q VGA to generate in phase and quadrature signals, and combining the in phase and quadrature signals from the I VGA and the Q VGA to generate a single-ended combined signal at a desired phase.

Another aspect of the disclosure provides a device for signal phase shifting including means for providing radio frequency (RF) receive signals to an in phase variable gain amplifier (I VGA) and to a quadrature variable gain amplifier (Q VGA), means for steering current through the I VGA and the Q VGA to generate in phase and quadrature signals, and means for combining the in phase and quadrature signals from the I VGA and the Q VGA to generate a single-ended combined signal at a desired phase.

Another aspect of the disclosure provides a communication system having a phase shifter including a plurality of communication paths configured to carry a corresponding plurality of radio frequency (RF) communication signals, a first of the plurality of communication paths having a first in phase variable gain amplifier (I VGA) and a first quadrature VGA (Q VGA), a second of the plurality of communication paths having a second I VGA and a second Q VGA, the first I VGA and the second I VGA coupled to a primary side of a first electromagnetic (EM) element, the first EM element configured to provide a single ended I output, the first Q VGA and the second Q VGA coupled to a primary side of a second EM element, the second EM element configured to provide a single ended Q output, and a hybrid quadrature generator (HQG) configured to receive the single-ended I output of the first EM element and the single-ended Q output of the second EM element, the HQG configured to provide a combined signal.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

DETAILED DESCRIPTION

The word "exemplary" is used herein to mean "serving as an example, instance, or illustration." Any aspect described herein as "exemplary" is not necessarily to be construed as preferred or advantageous over other aspects.

In accordance with an exemplary embodiment, a radio architecture has a single-ended shared phase shifter that is shared between two adjacent RX elements, thus reducing circuit area.

In accordance with an exemplary embodiment, a radio architecture has a single-ended shared phase shifter that is shared between two adjacent RX elements and TX elements, thus further reducing circuit area.

In accordance with an exemplary embodiment, a shared phase shifter may be implemented as a single-ended device and may include two (2) single-ended input IQ variable gain amplifiers (VGAs) with pseudo-differential output transformation.

In accordance with an exemplary embodiment, a shared phase shifter may include a first stage that is a VGA configured to perform vector modulation, thus eliminating a second stage of a low noise amplifier (LNA).

In accordance with an exemplary embodiment, a shared phase shifter also shares a hybrid quadrature generator (HQG), which is also shared between the two adjacent RX elements.

In accordance with an exemplary embodiment, a shared phase shifter reduces the number of electromagnetic (EM) elements in a signal path.

Figure 1:
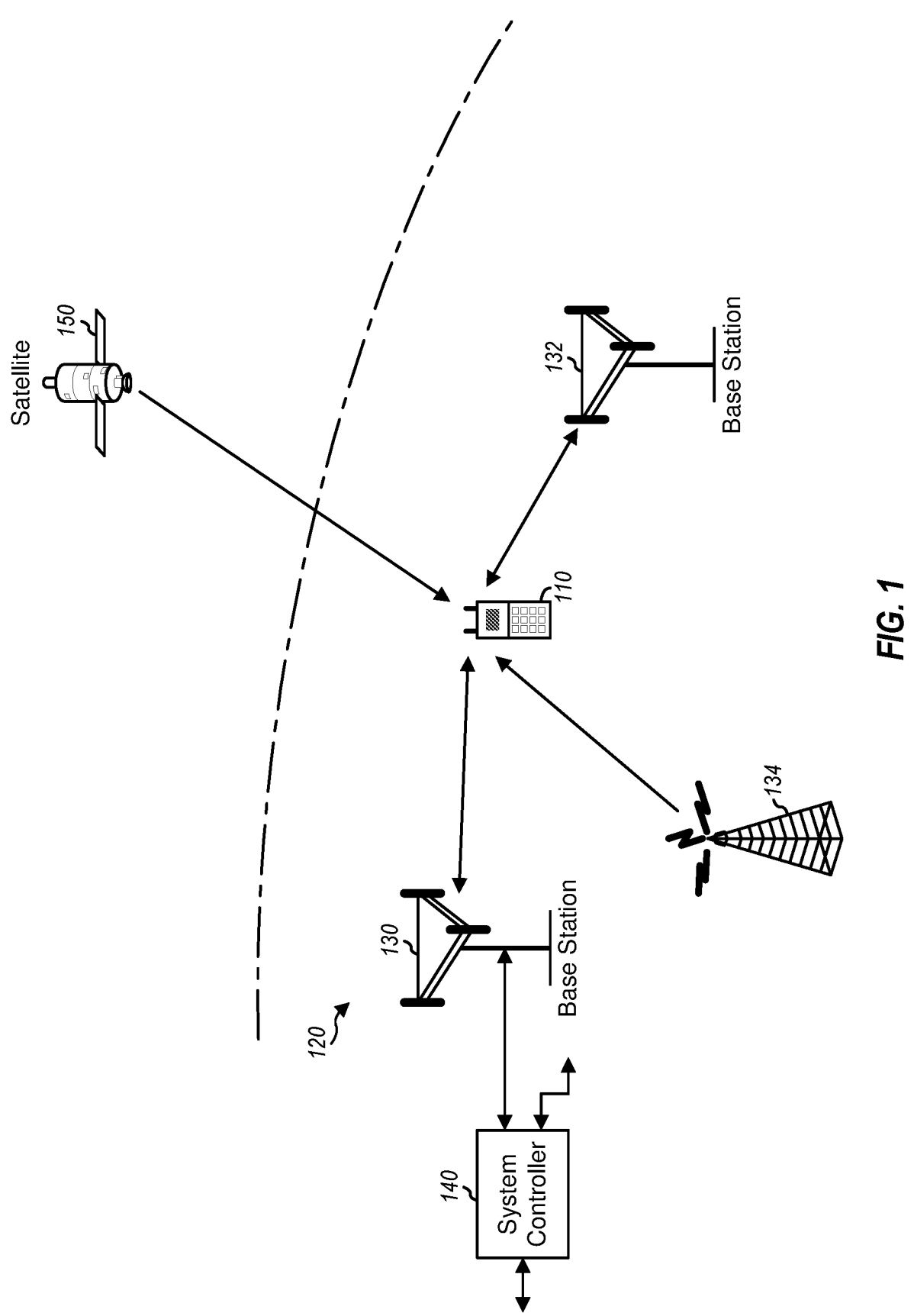
FIG. 1 is a diagram showing a wireless device communicating with a wireless communication system.

FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, a 5G NR (new radio) system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a hand-held device, a laptop computer, a smartbook, a netbook, a tablet, a cordless phone, a medical device, an automobile, a device configured to connect to one or more other devices (for example through the internet of things), a wireless local loop (WLL) station, a Bluetooth device, etc. Wireless device 110 may communicate with wireless communication system 120. Wireless device 110 may also receive signals from broadcast stations (e.g., a broadcast station 134) and/or may communicate with satellites (e.g., a satellite 150 in one or more global navigation satellite systems (GNSS)), or a satellite that can receive signals from the wireless device 110, etc.). Wireless device 110 may support one or more radio technologies for wireless communication such as LTE, WCDMA, CDMA 1x, EVDO, TD-SCDMA, GSM, 802.11, 802.15, 5G, Sub6 5G, 6G, UWB, etc.

Wireless device 110 may support carrier aggregation, for example as described in one or more LTE or 5G standards. In some embodiments, a single stream of data is transmitted over multiple carriers using carrier aggregation, for example as opposed to separate carriers being used for respective data streams. Wireless device 110 may be able to operate in a variety of communication bands including, for example, those communication bands used by LTE, WiFi, 5G or other communication bands, over a wide range of frequencies. Wireless device 110 may also be capable of communicating directly with other wireless devices without communicating through a network.

In general, carrier aggregation (CA) may be categorized into two types-intra-band CA and inter-band CA. Intra-band CA refers to operation on multiple carriers within the same band. Inter-band CA refers to operation on multiple carriers in different bands.

Figure 2A:
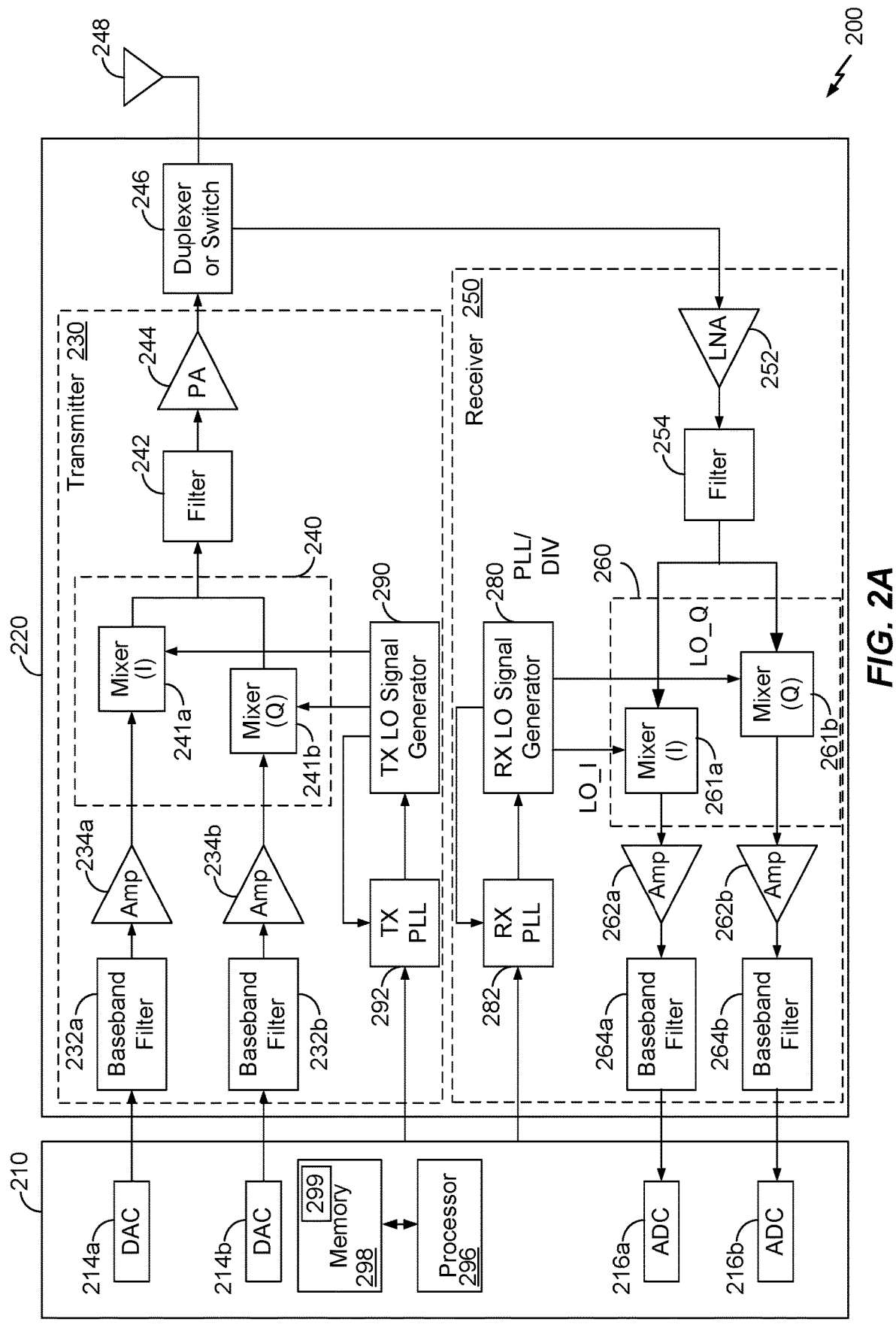
FIG. 2A is a block diagram showing a wireless device in which exemplary techniques of the present disclosure may be implemented.

FIG. 2A is a block diagram showing a wireless device 200 in which exemplary techniques of the present disclosure may be implemented. The wireless device 200 may, for example, be an embodiment of the wireless device 110 illustrated in FIG. 1.

FIG. 2A shows an example of a transceiver 220 having a transmitter 230 and a receiver 250. In general, the conditioning of the signals in the transmitter 230 and the receiver 250 may be performed by one or more stages of amplifier, filter, upconverter, downconverter, etc. These circuit blocks may be arranged differently from the configuration shown in FIG. 2A. Furthermore, other circuit blocks not shown in FIG. 2A may also be used to condition the signals in the transmitter 230 and receiver 250. Unless otherwise noted, any signal in FIG. 2A, or any other figure in the drawings, may be either single-ended or differential. Some circuit blocks in FIG. 2A may also be omitted.

In the example shown in FIG. 2A, wireless device 200 generally comprises the transceiver 220 and a data processor 210. The data processor 210 may include a processor 296 operatively coupled to a memory 298. The memory 298 may be configured to store data and program codes shown generally using reference numeral 299, and may generally comprise analog and/or digital processing components. The processor 296 and the memory 298 may cooperate to control, configure, program, or otherwise fully or partially control some or all of the operation of the embodiments of the phase shifter described herein.

The transceiver 220 includes a transmitter 230 and a receiver 250 that support bi-directional communication. In general, wireless device 200 may include any number of transmitters and/or receivers for any number of communication systems and frequency bands. All or a portion of the transceiver 220 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 2A, transmitter 230 and receiver 250 are implemented with the direct-conversion architecture.

In the transmit path, the data processor 210 processes data to be transmitted and provides in-phase (I) and quadrature (Q) analog output signals to the transmitter 230. In an exemplary embodiment, the data processor 210 includes digital-to-analog-converters (DAC's) 214a and 214b for converting digital signals generated by the data processor 210 into the I and Q analog output signals, e.g., I and Q output currents, for further processing. In other embodiments, the DACs 214a and 214b are included in the transceiver 220 and the data processor 210 provides data (e.g., for I and Q) to the transceiver 220 digitally.

Within the transmitter 230, baseband (e.g., lowpass) filters 232a and 232b filter the I and Q analog transmit signals, respectively, to remove undesired images caused by the prior digital-to-analog conversion. Amplifiers (Amp) 234a and 234b amplify the signals from baseband filters 232a and 232b, respectively, and provide I and Q baseband signals. An upconverter 240 having upconversion mixers 241a and 241b upconverts the I and Q baseband signals with I and Q transmit (TX) local oscillator (LO) signals from a TX LO signal generator 290 and provides an upconverted signal. A filter 242 filters the upconverted signal to remove undesired images caused by the frequency upconversion as well as noise in a receive frequency band. A power amplifier (PA) 244 amplifies the signal from filter 242 to obtain the desired output power level and provides a transmit RF signal. The transmit RF signal may be routed through a duplexer or switch 246 and transmitted via an antenna 248. While examples discussed herein utilize I and Q signals, those of skill in the art will understand that components of the transceiver may be configured to utilize polar modulation.

In the receive path, antenna 248 receives communication signals and provides a received RF signal, which may be routed through duplexer or switch 246 and provided to a low noise amplifier (LNA) 252. The duplexer 246 is designed to operate with a specific RX-to-TX duplexer frequency separation, such that RX signals are isolated from TX signals. The received RF signal is amplified by LNA 252 and filtered by a filter 254 to obtain a desired RF input signal.

Downconversion mixers 261a and 261b in a downconverter 260 mix the output of filter 254 with I and Q receive (RX) LO signals (i.e., LO_I and LO_Q) from an RX LO signal generator 280 to generate I and Q baseband signals. The I and Q baseband signals are amplified by amplifiers 262a and 262b and further filtered by baseband (e.g., lowpass) filters 264a and 264b to obtain I and Q analog input signals, which are provided to data processor 210. In the exemplary embodiment shown, the data processor 210 includes analog-to-digital-converters (ADC's) 216a and 216b for converting the analog input signals into digital signals to be further processed by the data processor 210. In some embodiments, the ADCs 216a and 216b are included in the transceiver 220 and provide data to the data processor 210 digitally.

In FIG. 2A, TX LO signal generator 290 generates the I and Q TX LO signals used for frequency upconversion, while RX LO signal generator 280 generates the I and Q RX LO signals used for frequency downconversion. Each LO signal is a periodic signal with a particular fundamental frequency. A phase locked loop (PLL) 292 receives timing information from data processor 210 and generates a control signal used to adjust the frequency and/or phase of the TX LO signals from LO signal generator 290. Similarly, a PLL 282 receives timing information from data processor 210 and generates a control signal used to adjust the frequency and/or phase of the RX LO signals from LO signal generator 280.

Wireless device 200 may support CA and may (i) receive multiple downlink signals transmitted by one or more cells on multiple downlink carriers at different frequencies and/or (ii) transmit multiple uplink signals to one or more cells on multiple uplink carriers. Those of skill in the art will understand, however, that aspects described herein may be implemented in systems, devices, and/or architectures that do not support carrier aggregation.

Certain components of the transceiver 220 are functionally illustrated in FIG. 2A, and the configuration illustrated therein may or may not be representative of a physical device configuration in certain implementations. For example, as described above, transceiver 220 may be implemented in various integrated circuits (ICs), RF ICs (RFICs), mixed-signal ICs, etc. In some embodiments, the transceiver 220 is implemented on a substrate or board such as a printed circuit board (PCB) having various modules, chips, and/or components. For example, the power amplifier 244, the filter 242, and the duplexer 246 may be implemented in separate modules or as discrete components, while the remaining components illustrated in the transceiver 220 may be implemented in a single transceiver chip.

The power amplifier 244 may comprise one or more stages comprising, for example, driver stages, power amplifier stages, or other components, that can be configured to amplify a communication signal on one or more frequencies, in one or more frequency bands, and at one or more power levels. Depending on various factors, the power amplifier 244 can be configured to operate using one or more driver stages, one or more power amplifier stages, one or more impedance matching networks, and can be configured to provide good linearity, efficiency, or a combination of good linearity and efficiency.

In an exemplary embodiment in a super-heterodyne architecture, the PA 244 and LNA 252 (and filter 242 and filter 254 in some examples) may be implemented separately from other components in the transmitter 230 and receiver 250, for example on a millimeter wave integrated circuit. An example super-heterodyne architecture is illustrated in FIG. 2B.

Figure 2B:
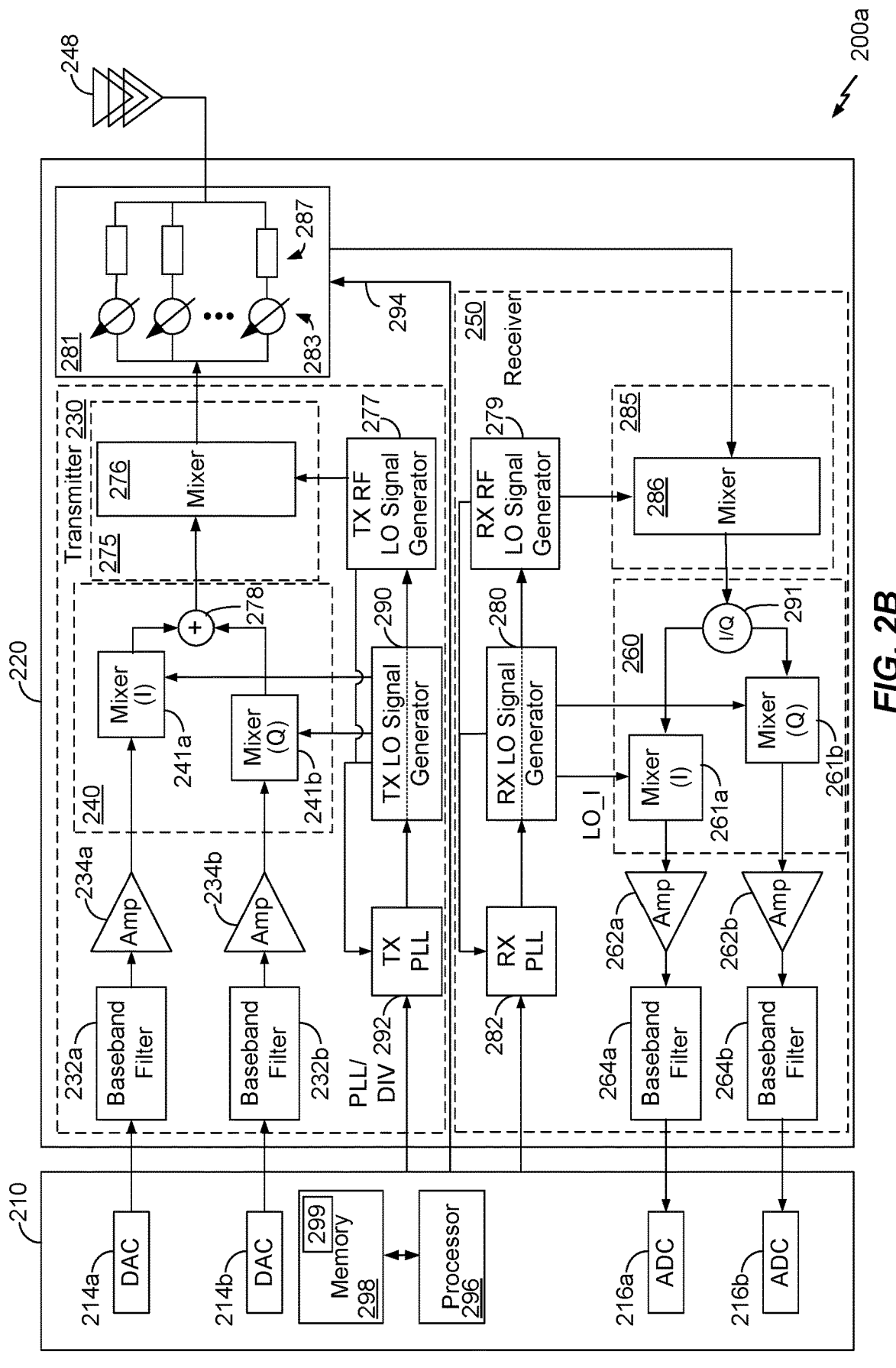
FIG. 2B is a block diagram showing a wireless device in which exemplary techniques of the present disclosure may be implemented.

FIG. 2B is a block diagram showing a wireless device in which exemplary techniques of the present disclosure may be implemented. Certain components, for example which may be indicated by identical reference numerals, of the wireless device 200a in FIG. 2B may be configured similarly to those in the wireless device 200 shown in FIG. 2A and the description of identically numbered items in FIG. 2B will not be repeated.

The wireless device 200a is an example of a heterodyne (or superheterodyne) architecture in which the upconverter 240 and the downconverter 260 are configured to process a communication signal between baseband and an intermediate frequency (IF). The IF signal may be a low IF (LIF) signal, or a zero (or near zero) IF (ZIF) signal. For example, the upconverter 240 may include a summing function 278 and may be configured to provide an IF signal to an upconverter 275. In an exemplary embodiment, the upconverter 275 may comprise upconversion mixer 276. The summing function 278 combines the I and the Q outputs of the upconverter 240 and provides a non-quadrature signal to the mixer 276. The non-quadrature signal may be single ended or differential. The mixer 276 is configured to receive the IF signal from the upconverter 240 and TX RF LO signals from a TX RF LO signal generator 277, and provide an upconverted RF signal to phase shift circuitry 281. While PLL 292 is illustrated in FIG. 2B as being shared by the signal generators 290, 277, a respective PLL for each signal generator may be implemented.

In an exemplary embodiment, components in the phase shift circuitry 281 may comprise one or more adjustable or variable phased array elements, and may receive one or more control signals from the data processor 210 over connection 294 and operate the adjustable or variable phased array elements based on the received control signals.

In an exemplary embodiment, the phase shift circuitry 281 comprises phase shifters 283 and phased array elements 287. Although three phase shifters 283 and three phased array elements 287 are shown for ease of illustration, the phase shift circuitry 281 may comprise more or fewer phase shifters 283 and phased array elements 287. For example, one or two arrays of four or five antennas and corresponding phase shifters/phased array elements may be implemented.

Each phase shifter 283 may be configured to receive the RF transmit signal from the upconverter 275, alter the phase by an amount, and provide the RF signal to a respective phased array element 287. Each phased array element 287 may comprise transmit and receive circuitry including one or more filters, amplifiers, driver amplifiers, and/or power amplifiers. In some embodiments, the phase shifters 283 may be incorporated within respective phased array elements 287.

The output of the phase shift circuitry 281 is provided to an antenna array 248. In an exemplary embodiment, the antenna array 248 comprises a number of antennas that typically correspond to the number of phase shifters 283 and phased array elements 287, for example such that each antenna element is coupled to a respective phased array element 287. In an exemplary embodiment, the phase shift circuitry 281 and the antenna array 248 may be referred to as a phased array.

In a receive direction, an output of the phase shift circuitry 281 is provided to a downconverter 285. In an exemplary embodiment, the downconverter 285 may comprise a down-conversion mixer 286. In an exemplary embodiment, the mixer 286 downconverts the receive RF signal provided by the phase shift circuitry 281 to an IF signal according to RX RF LO signals provided by an RX RF LO signal generator 279. The downconverter 260 includes an I/Q generation function 291. The I/Q generation function 291 receives the IF signal from the mixer 286 and generates I and Q signals for the downconverter 260, which downconverts the IF signals to baseband, as described above. While PLL 282 is illustrated in FIG. 2B as being shared by the signal generators 280, 279, a respective PLL for each signal generator may be implemented.

In some embodiments, the upconverter 275, downconverter 285, and the phase shift circuitry 281 are implemented on a common IC. In some embodiments, the summing function 278 and the I/Q generation function 291 are implemented separate from the mixers 276 and 286 such that the mixers 276, 286 and the phase shift circuitry 281 are implemented on the common IC, but the summing function 278 and I/Q generation function 291 are not (e.g., the summing function 278 and I/Q generation function 291 are implemented in another IC coupled to the IC having the mixers 276, 286). In some embodiments, the LO signal generators 277, 279 are included in the common IC. In some embodiments in which phase shift circuitry is implemented on a common IC with 276, 286, 277, 278, 279, and/or 291, the common IC and the antenna array 248 are included in a module, which may be coupled to other components of the transceiver 220 via a connector. In some embodiments, the phase shift circuitry 281, for example, a chip on which the phase shift circuitry 281 is implemented, is coupled to the antenna array 248 by an interconnect or both are mounted to a substrate. For example, components of the antenna array 248 may be implemented on a substrate and coupled to an integrated circuit implementing the phase shift circuitry 281 via a flexible printed circuit or the integrated circuit may be mounted to an opposite side of the substrate.

In some embodiments, both the architecture illustrated in FIG. 2A and the architecture illustrated in FIG. 2B are implemented in the same device. For example, a wireless device 110 or 200 may be configured to communicate with signals having a frequency below about 20 GHz using the architecture illustrated in FIG. 2A and to communicate with signals having a frequency above about 20 GHz using the architecture illustrated in FIG. 2B. In devices in which both architectures are implemented, one or more components of FIGS. 2A and 2B that are identically numbered may be shared between the two architectures. For example, both signals that have been downconverted directly to baseband from RF and signals that have been downconverted from RF to baseband via an IF stage may be filtered by the same baseband filter 264. In other embodiments, a first version of the filter 264 is included in the portion of the device which implements the architecture of FIG. 2A and a second version of the filter 264 is included in the portion of the device which implements the architecture of FIG. 2B. While certain example frequencies are described herein, other implementations are possible. For example, signals having a frequency above about 20 GHz (e.g., having a mmW frequency) may be transmitted and/or received using a direct conversion architecture. In such embodiments, for example, a phased array may be implemented in the direct conversion architecture.

Figure 2C:
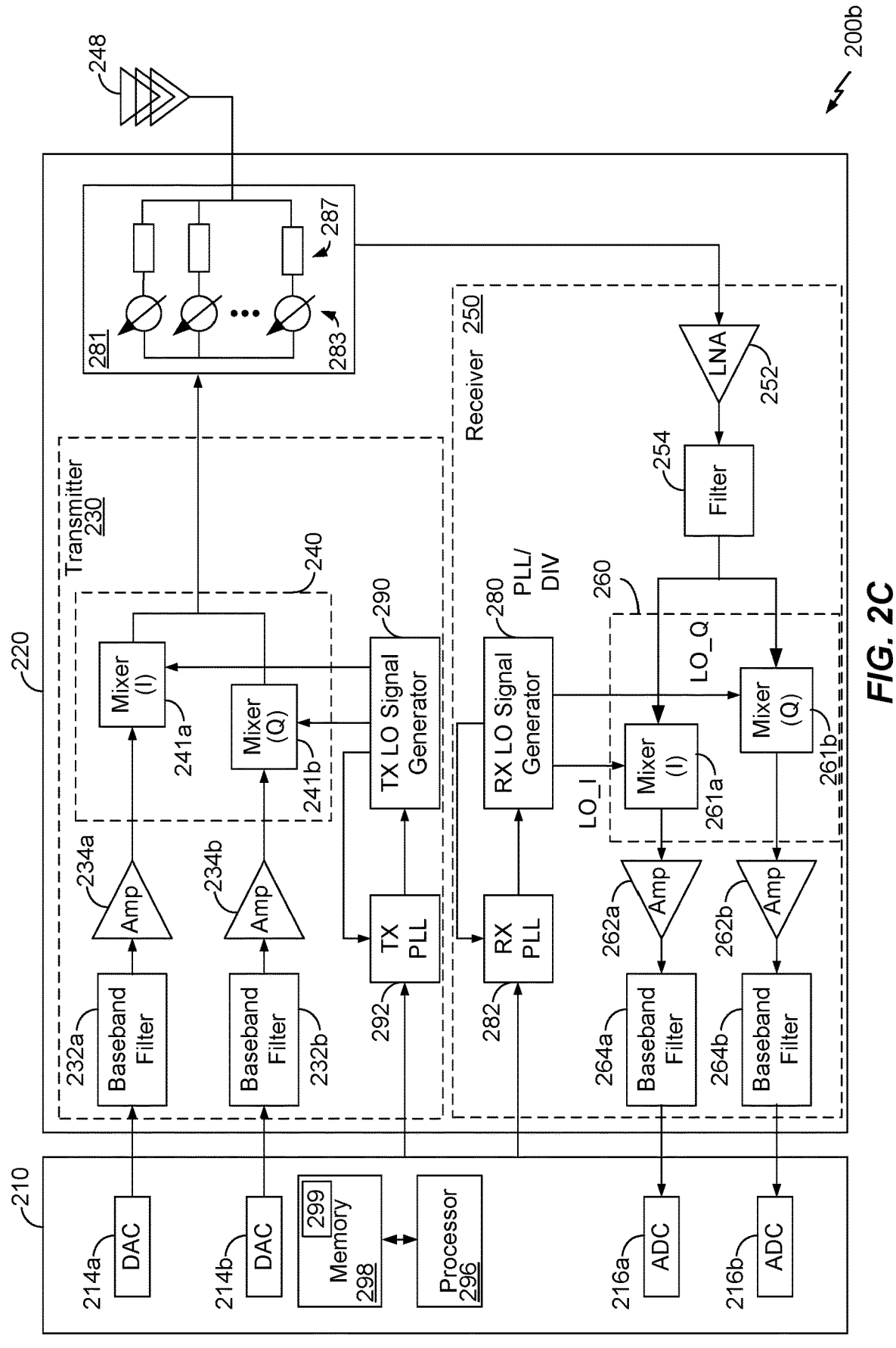
FIG. 2C is a block diagram showing a wireless device in which exemplary techniques of the present disclosure may be implemented.

FIG. 2C is a block diagram showing a wireless device in which exemplary techniques of the present disclosure may be implemented. Certain components, for example which may be indicated by identical reference numerals, of the wireless device 200b in FIG. 2C may be configured similarly to those in the wireless device 200 shown in FIG. 2A and/or the wireless device 200a shown in FIG. 2B and the description of identically numbered items in FIG. 2C will not be repeated.

The wireless device 200b in FIG. 2C incorporates the phase shift circuitry 281 (of FIG. 2B) in a direct conversion architecture, where mmW transmission signals are upconverted and downconverted between baseband and RF without the use of intermediate frequency (IF) signal conversion. For example, the LO signals in the architecture of FIG. 2C may comprise signals at frequencies of tens of GHZ.

In some embodiments, the upconverter 240, downconverter 260, and the phase shift circuitry 281 are implemented on a common IC. In some embodiments, the LO signal generators 280, 290 are included in the common IC. In some embodiments, the common IC and the antenna array 248 are included in a module, which may be coupled to other components of the transceiver 220 via a connector. In some embodiments, the phase shift circuitry 281, for example, a chip on which the phase shift circuitry 281 is implemented, is coupled to the antenna array 248 by an interconnect or both are mounted to a substrate. For example, components of the antenna array 248 may be implemented on a substrate and coupled to an integrated circuit implementing the phase shift circuitry 281 via a flexible printed circuit or the integrated circuit may be mounted to an opposite side of the substrate.

Figure 3:
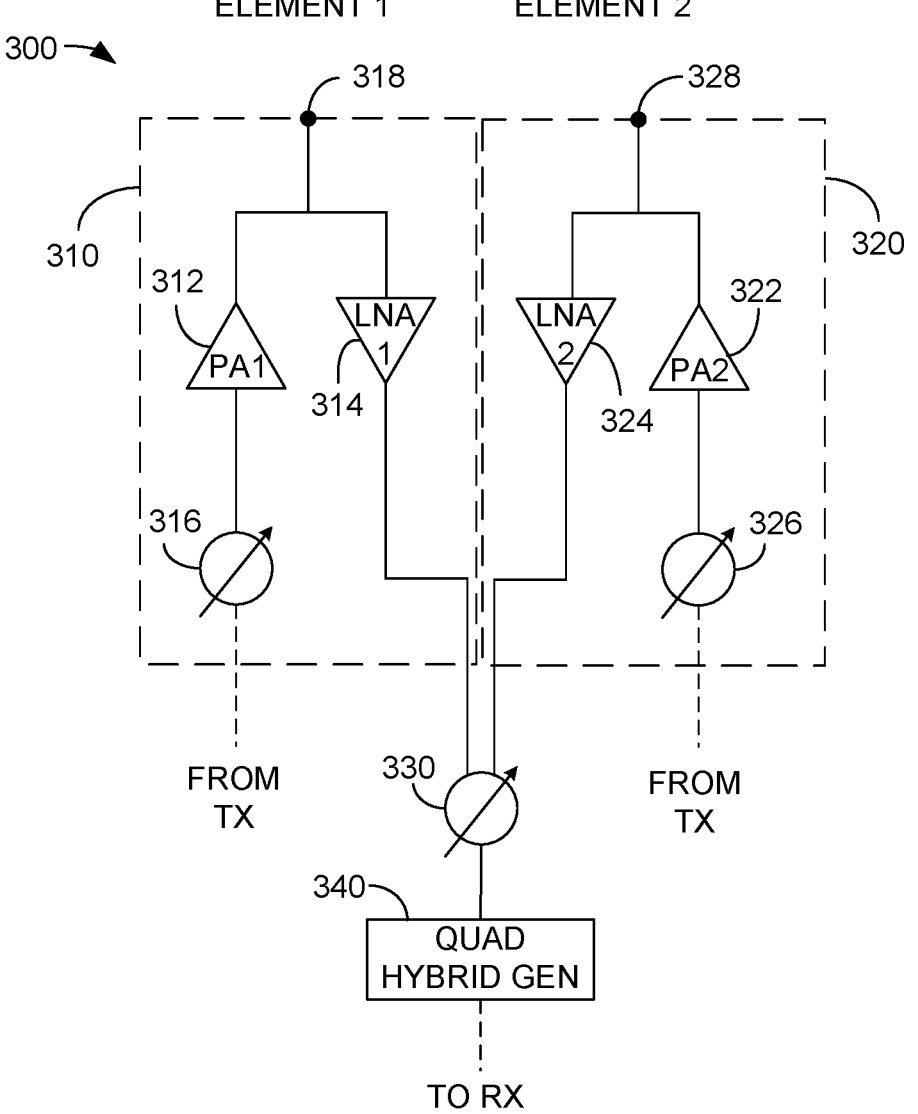
FIG. 3 is a block diagram of two transmit (TX) and receive (RX) elements in a phased array system.

FIG. 3 is a block diagram 300 of two transmit (TX) and receive (RX) elements in a phased array system, for example as may be included in the phase shift circuitry 281. A first element 310 may comprise TX circuitry including a power amplifier (PA) 312 and RX circuitry including a low noise amplifier (LNA) 314. A second element 320 may comprise TX circuitry including a power amplifier (PA) 322 and RX circuitry including a low noise amplifier (LNA) 324. The first element 310 and the second element 320 may be part of a phased array system having many tens or hundreds of elements, or having fewer elements.

The first element 310 may also comprise a TX phase shifter 316 and the second element 320 may also comprise a TX phase shifter 326.

A receive phase shifter 330 may be connected to the LNA 314 and to the LNA 324. In accordance with an exemplary embodiment of the disclosure, a single RX phase shifter 330 represents a portion of a phase shifter circuit that includes, for example, a vector modulator circuit and an electromagnetic coupling circuit. In an exemplary embodiment, the electromagnetic coupling circuit may be shared between the LNA 314 and the LNA 324, as will be described below. An output of the phase shifter 330 is provided to a hybrid quadrature generator (HQG) 340. In an exemplary embodiment, the HQG 340 may also be shared between the LNA 314 and the LNA 324.

Figure 4:
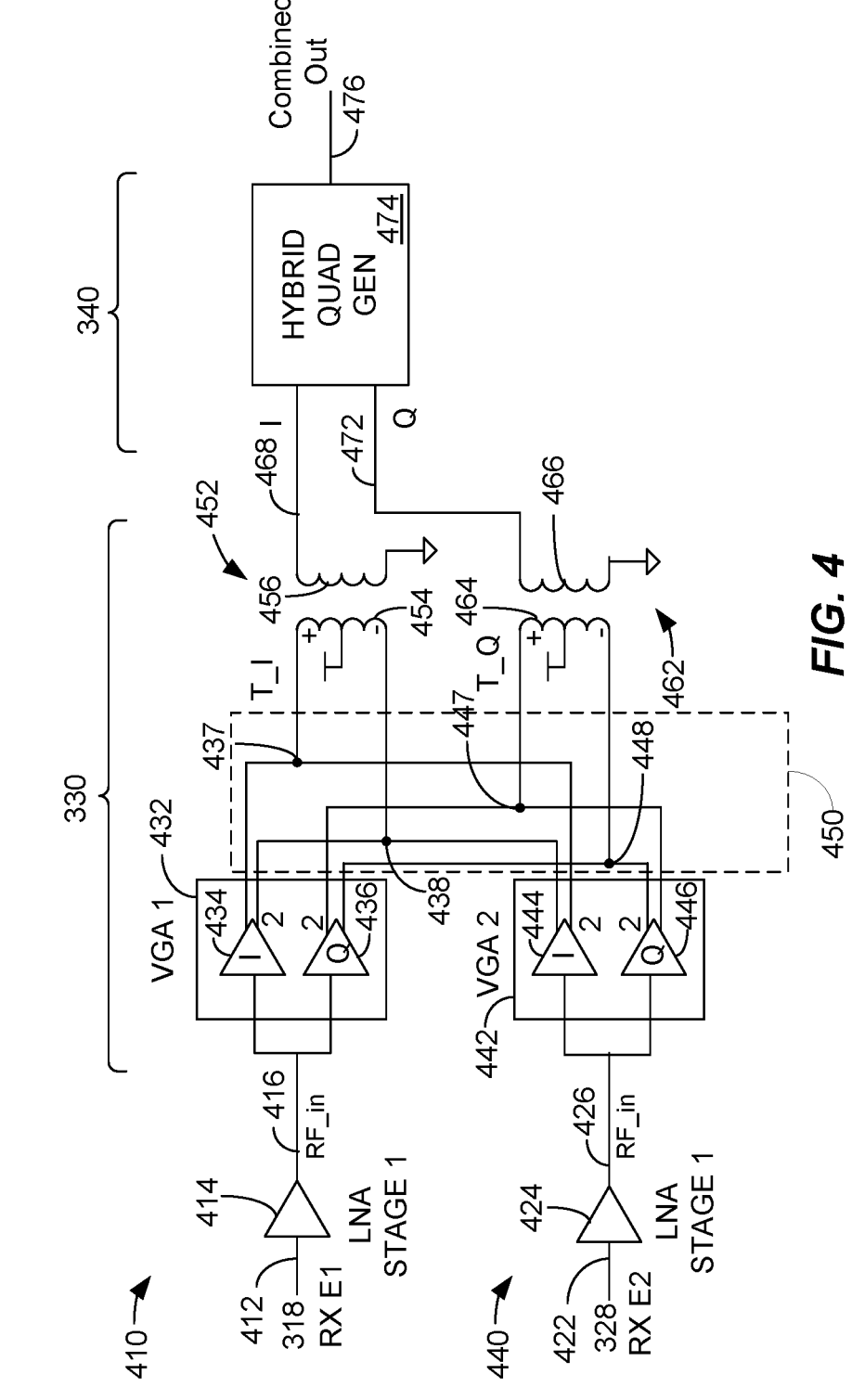
FIG. 4 is a block diagram of a circuit showing a detailed view of the phase shifter and HQG of FIG. 3.

FIG. 4 is a block diagram of a circuit 400 showing a detailed view of the phase shifter 330 and HQG 340 of FIG. 3. In an exemplary embodiment, the circuit 400 may include a first signal path 410 and a second signal path 440. The first signal path 410 may comprise a low noise amplifier 414 and a variable gain amplifier (VGA) 432. In an exemplary embodiment, the LNA 414 may comprise a first stage LNA, and may be an example of the LNA 314 of FIG. 3. The VGA 432 may comprise a VGA 434 configured to amplify signals for an in phase (I) component (I VGA) and a VGA 436 configured to amplify signals for a quadrature (Q) component (Q VGA).

In an exemplary embodiment, the VGA 432 may be a single-ended device and may include two (2) single-ended input I/Q variable gain amplifiers (VGAs) 434 and 436.

The second signal path 440 may comprise a low noise amplifier 424 and a variable gain amplifier (VGA) 442. In an exemplary embodiment, the LNA 424 may comprise a first stage LNA, and may be an example of the LNA 324 of FIG. 3. The VGA 442 may comprise a VGA 444 configured to amplify signals for an in phase (I) component (I VGA) and a VGA 446 configured to amplify signals for a quadrature (Q) component (Q VGA).

In an exemplary embodiment, the VGA 442 may be a single-ended device and may include two (2) single-ended input IQ variable gain amplifiers (VGAs) 444 and 446.

As used herein, the "term pseudo-differential output transformation" refers to the VGAs 434 and 436 being single-ended and selectively providing separate single-ended outputs to the nodes 437, 438, 447 and 448, as is further explained below. The VGA 444 and the VGA 446 are similarly configured. In an exemplary embodiment, a "psuedo-differential output transformation" also refers to the way signals at the node 437 and the node 438 appear in phase, but would appear out of phase by 180 degrees at the connection 468. Similarly, signals at the node 447 and the node 448 appear in phase, but would appear out of phase by 180 degrees at the connection 472. In an exemplary embodiment, the VGA 434 provides two separate single-ended outputs, where one single-ended output is selectively provided to node 437 and the other single-ended output is selectively provided to node 438. The VGA 436 provides two separate single-ended outputs, where one single-ended output is selectively provided to node 447 and the other single-ended output is selectively provided to node 448. Similarly, the VGA 444 provides two separate single-ended outputs, where one single-ended output is selectively provided to node 437 and the other single-ended output is selectively provided to node 438; and the VGA 446 provides two separate single-ended outputs, where one single-ended output is selectively provided to node 447 and the other single-ended output is selectively provided to node 448.

For example, the "same" signal from the VGA 434 would be provided to node 437 or to node 438 depending on the desired polarity (or sign, 0/180) at the connection 468. A signal provided from the VGA 434 to the node 437 would undergo some intrinsic amount of phase shift before appearing at the connection 468 due to the components it passes through (e.g., an intrinsic phase shift of "theta"). If that "same" signal was provided from the VGA 434 to the connection 468 via the node 438 instead, then that intrinsic phase shift would be theta+180 degrees.

The signal on connection 468 and the signal on connection 472 may be provided to the HQG 474 simultaneously. The signal on connection 468 is 180 degrees out of phase with respect to the signal on connection 472. In an exemplary embodiment, the operation of the HQG 474 takes the signals on connections 468 and 472 as inputs and produces the output on connection 476 according to the operation I+j*Q, where j represents a 90 degree phase shift, I is the signal on connection 468 and Q is the signal on connection 472. The signal that appears at connection 476 due to the signal on connection 472 (Q) is 90 degrees shifted from the signal that appears at the output on connection 476 due to the signal on connection 468 (I).

In an exemplary embodiment, placing the VGAs 432 and 442 ahead of the HQG 474 in the signal paths 410 and 440, allows the number of stages in the LNA to be reduced, thereby saving area while conserving the receiver noise figure. In an exemplary embodiment, the VGAs 432 and 442 perform amplification and vector modulation to effectively provide phase shift to the signals on connections 416 and 426 from the two separate signal paths 410 and 440.

In an exemplary embodiment, the outputs of the VGA 432 and the outputs of the VGA 442 are provided to a connection network 450. The connection network 450 may be any network capable of providing the separate I outputs from the VGAs 434 and 444, and the separate Q outputs from the VGAs 436 and 446 to the positive and negative terminals of the primary sides of the transformers 452 and 462. For example, the separate I outputs of the VGA 434 may be selectively provided to a node 437 and to a node 438. Similarly, the separate I outputs of the VGA 444 may be selectively provided to the node 437 and to the node 438. Similarly, the separate Q outputs of the VGA 436 may be selectively provided to a node 447 and to a node 488. Similarly, the separate Q outputs of the VGA 446 may be selectively provided to the node 447 and to the node 448. As will be described in greater detail below, the outputs of the I VGA 434 and the I VGA 444 may be selectively controlled by controlling the current flow through the I VGA 434 and the I VGA 444. Similarly, the outputs of the Q VGA 436 and the Q VGA 446 may be selectively controlled by controlling the current flow through the Q VGA 436 and the Q VGA 446.

In an exemplary embodiment, the transformer 452 may be configured to receive the in phase (I) signals and includes a primary side 454 and a secondary side 456. In an exemplary embodiment, the transformer 462 may be configured to receive the quadrature (Q) signals and includes a primary side 464 and a secondary side 466.

In an exemplary embodiment, the primary side 454 and the primary side 464 may be configured to receive "positive" or "negative" signals and the secondary side 456 and the secondary side 466 may be configured to provide single-ended signals. In an exemplary embodiment, the transformers 452 and 462 can be driven from their respective positive terminals (node 437 or node 447) or their negative terminals (node 438 or node 448) or a combination of the positive and negative terminals if receiving signals from both the VGA 432 and the VGA 442 simultaneously.

An I output of the transformer 452 may be provided to the HQG 474 over connection 468 and the Q output of the transformer 462 may be provided to the HQG 474 over connection 472. The output of the HQG 474 on connection 476 is a combined output at a desired phase between 0 and 360 degrees.

Figure 5:
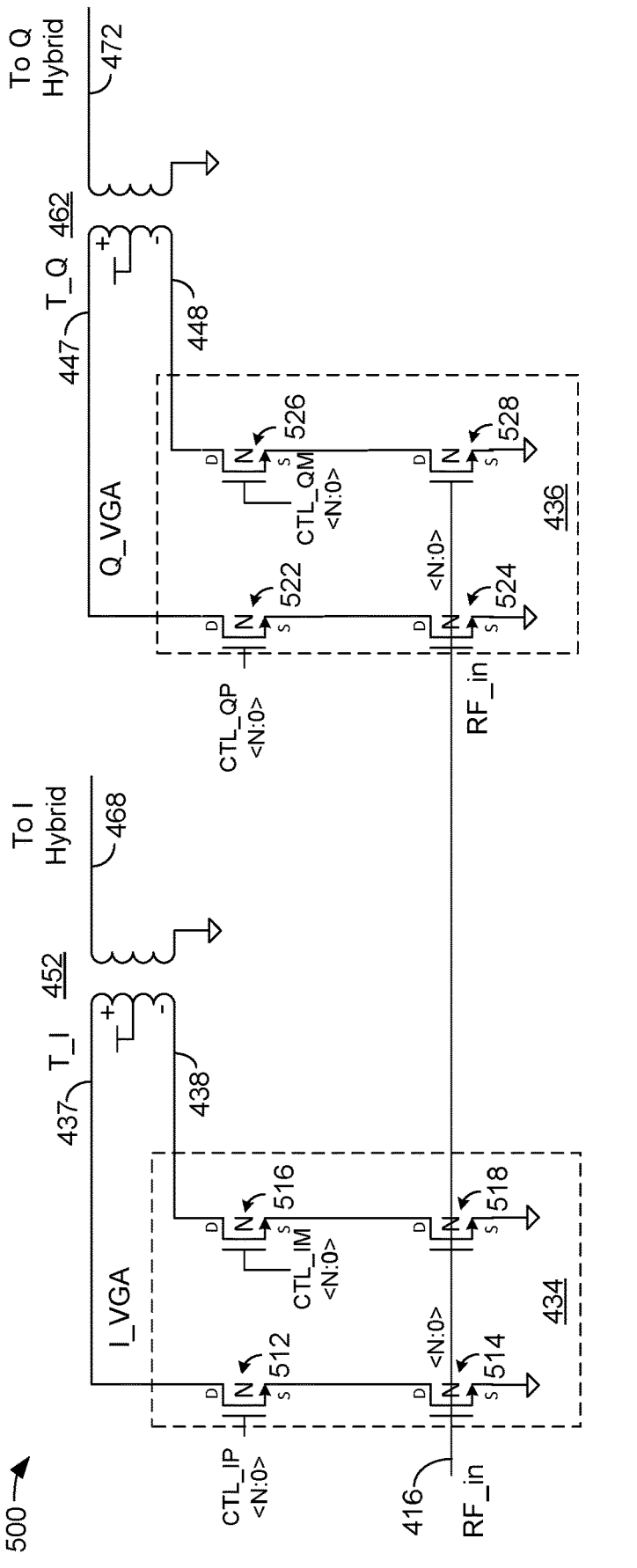
FIG. 5 is a diagram showing a detailed view of a portion of the phase shifter of FIG. 3 and FIG. 4.

FIG. 5 is a diagram showing a detailed view of a portion of the phase shifter 330 of FIG. 3 and FIG. 4. In an exemplary embodiment, the circuit 500 includes the I VGA 434 and the Q VGA 436 of FIG. 4. The phase shifter 330 also includes a similar circuit for the I VGA 444 and the Q VGA 446 of FIG. 4, but the I VGA 444 and the Q VGA 446 are omitted from FIG. 5 for clarity. In an exemplary embodiment, the I VGA 434 may comprise transistors 512 and 514 and transistors 516 and 518. In an exemplary embodiment, the Q VGA 436 may comprise transistors 522 and 524 and transistors 526 and 528. In an exemplary embodiment, the I VGA 434 and the Q VGA 436 may comprise multiple (e.g., N+1) iterations, or slices, each having the structure shown. The reference <N:0> refers to the array of iterations or slices of each of the I VGA 434 and the Q VGA 436.

In an exemplary embodiment, the transistors 512 and 514 may be arranged in a cascode architecture where the transistor 514 is configured to receive the RF input signal, RF_in (416), and the transistor 512 is configured as the cascode transistor. The transistor 512 is configured to receive a control signal, CTL_IP<N:0> at its gate. Similarly, the transistors 516 and 518 may be arranged in a cascode architecture where the transistor 518 is configured to receive the RF input signal, RF_in (416), and the transistor 516 is configured as the cascode transistor. The transistor 516 is configured to receive a control signal, CTL_IM<N:0> at its gate.

In an exemplary embodiment, the transistors 522 and 524 may be arranged in a cascode architecture where the transistor 524 is configured to receive the RF input signal, RF_in (416), and the transistor 522 is configured as the cascode transistor. The transistor 522 is configured to receive a control signal, CTL_QP<N:0> at its gate. Similarly, the transistors 526 and 528 may be arranged in a cascode architecture where the transistor 528 is configured to receive the RF input signal, RF_in (416), and the transistor 526 is configured as the cascode transistor. The transistor 526 is configured to receive a control signal, CTL_QM<N:0> at its gate. The control signals CTL_IP<N:0>, CTL_IM<N:0>, CTL_QP<N:0>, and CTL_QM<N:0> may be provided by the data processor 210 or another controller. In an exemplary embodiment, the control signals CTL_IP<N:0>, CTL_IM<N:0> determine the amount and the direction of current flowing into the primary side of the transformer 452; and the control signals CTL_QP<N:0>, and CTL_QM<N:0> determine the amount and the direction of current flowing into the primary side of the transformer 462. In an exemplary embodiment, the amount and the direction of current flowing into the primary sides of the transformers 452 and 462 can be used to determine, or set, the phase of the signals appearing at the secondary sides of the transformers 452 and 462 on connections 468 and 472, respectively. In an exemplary embodiment, the control signals CTL_IP<N:0>, CTL_IM<N:0>, CTL_QP<N:0>, and CTL_QM<N:0> allow current to be steered to positive and negative terminals of the primary sides of the transformers 452 and 462, which are used to provide 0/180 and 90/270 degree phase shifts respectively, thus allowing phase angle adjustments ranging from 0° to 360°. The secondary sides of the transformers 452 and 462 are single ended. The transformers 452 and 462 also provide current-to-voltage combining for the two signal paths 410 and 440 (FIG. 4). The transformers 452, 462 may further be coupled (e.g., at a center tap) to a supply voltage.

Figure 6:
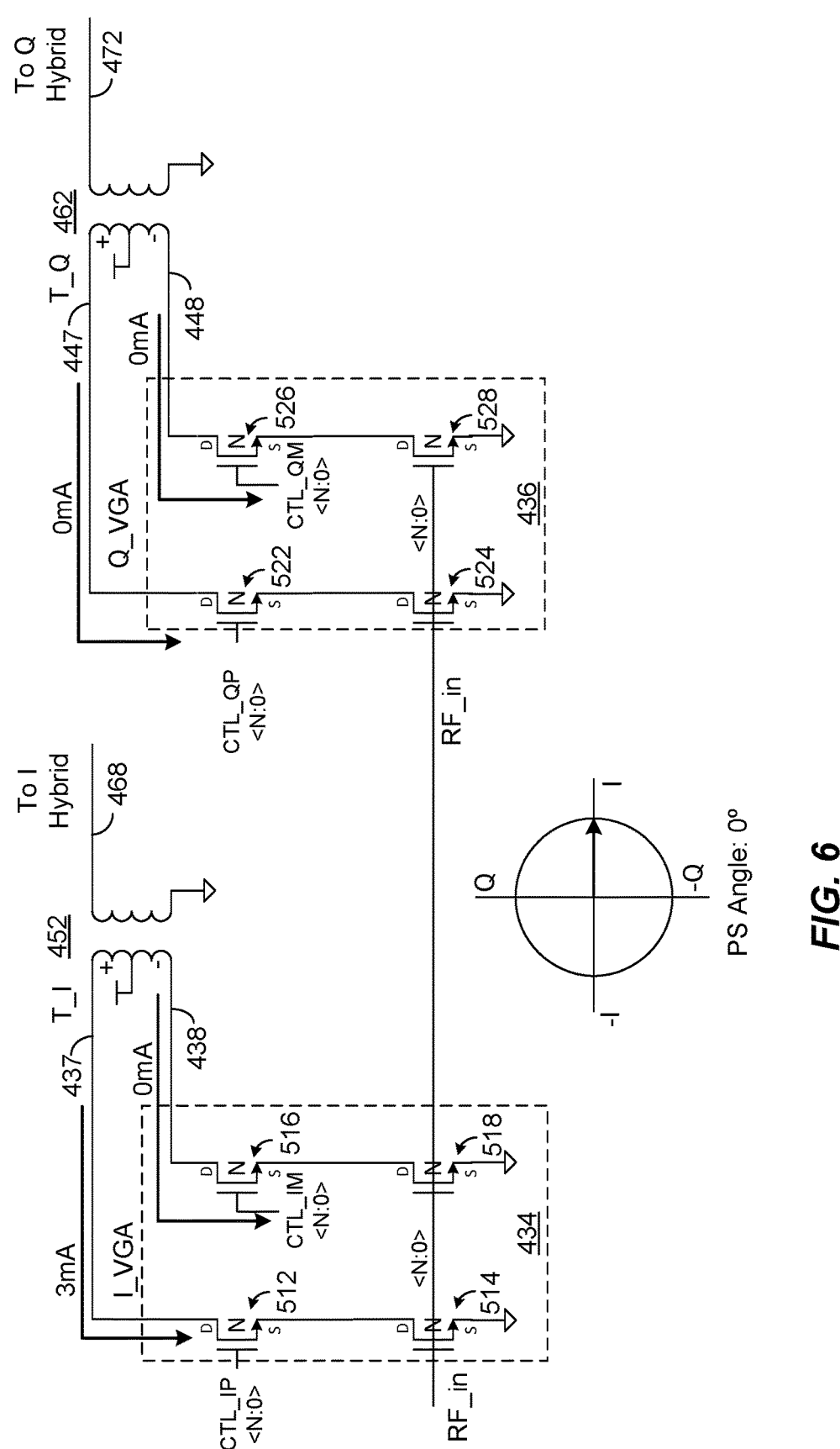
FIG. 6 is a diagram showing a detailed view of the portion of the phase shifter of FIG. 5 configured to generate a particular phase angle.

FIG. 6 is a diagram showing a detailed view of the portion of the phase shifter of FIG. 5 configured to generate a particular phase angle. In an exemplary embodiment, the circuit 600 is configured to provide a 0° phase angle using an RF input signal at a frequency of 27 GHz. In the exemplary embodiment shown in FIG. 6, the control signals CTL_IP<N:0>, CTL_IM<N:0>, CTL_QP<N:0>, and CTL_QM<N:0> are provided to the transistors 512, 516, 522 and 526, respectively, such that there is an approximate 3 mA current flowing through the transistors 512 and 514 in the I VGA 434 and an approximate 0 mA current flowing through the transistors 516 and 518 in the I VGA 434, an approximate 0 mA current flowing through the transistors 522 and 524 in the Q VGA 436 and an approximate 0 mA current flowing through the transistors 526 and 528 in the Q VGA 436. In this arrangement, the signals on connections 468 and 472 when combined by the HQG 474 (FIG. 4) result in a combined 0° phase signal at the output of the HQG 474 on connection 476 (FIG. 4). The current values mentioned with respect to FIG. 6 and other figures herein are for exemplary purposes only and may vary based on implementation, process and other factors. In some embodiments, a certain number of slices of the I VGA 434 and the Q VGA 436 may be turned on/off to produce the desired current described herein, where all on equals full current, all off equals zero current, and some on some off equals a current somewhere in between full current and zero current.

Figure 7:
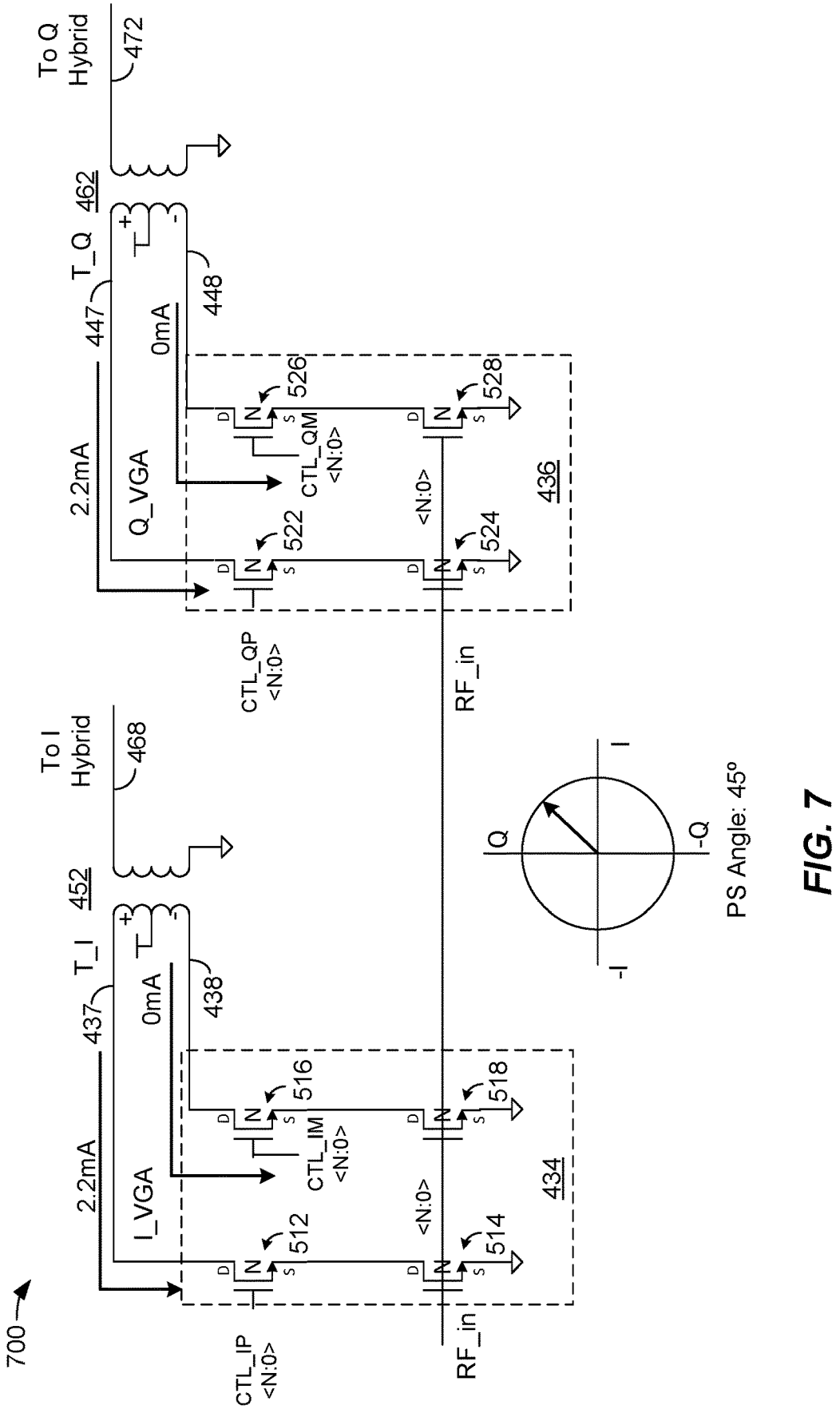
FIG. 7 is a diagram showing a detailed view of the portion of the phase shifter of FIG. 5 configured to generate a particular phase angle.

FIG. 7 is a diagram showing a detailed view of the portion of the phase shifter of FIG. 5 configured to generate a particular phase angle. In an exemplary embodiment, the circuit 700 is configured to provide a 45° phase angle using an RF input signal at a frequency of 27 GHz. In the exemplary embodiment shown in FIG. 7, the control signals CTL_IP<N:0>, CTL_IM<N:0>, CTL_QP<N:0>, and CTL_QM<N:0> are provided to the transistors 512, 516, 522 and 526, respectively, such that there is an approximate 2.2 mA current flowing through the transistors 512 and 514 in the I VGA 434, an approximate 0 mA current flowing through the transistors 516 and 518 in the I VGA 434, an approximate 2.2 mA current flowing through the transistors 522 and 524 in the Q VGA 436 and an approximate 0 mA current flowing through the transistors 526 and 528 in the Q VGA 436. This arrangement results in signals on connections 468 and 472 that when combined by the HQG 474 (FIG. 4) result in a combined 45° phase signal at the output of the HQG 474 on connection 476 (FIG. 4).

Figure 8:
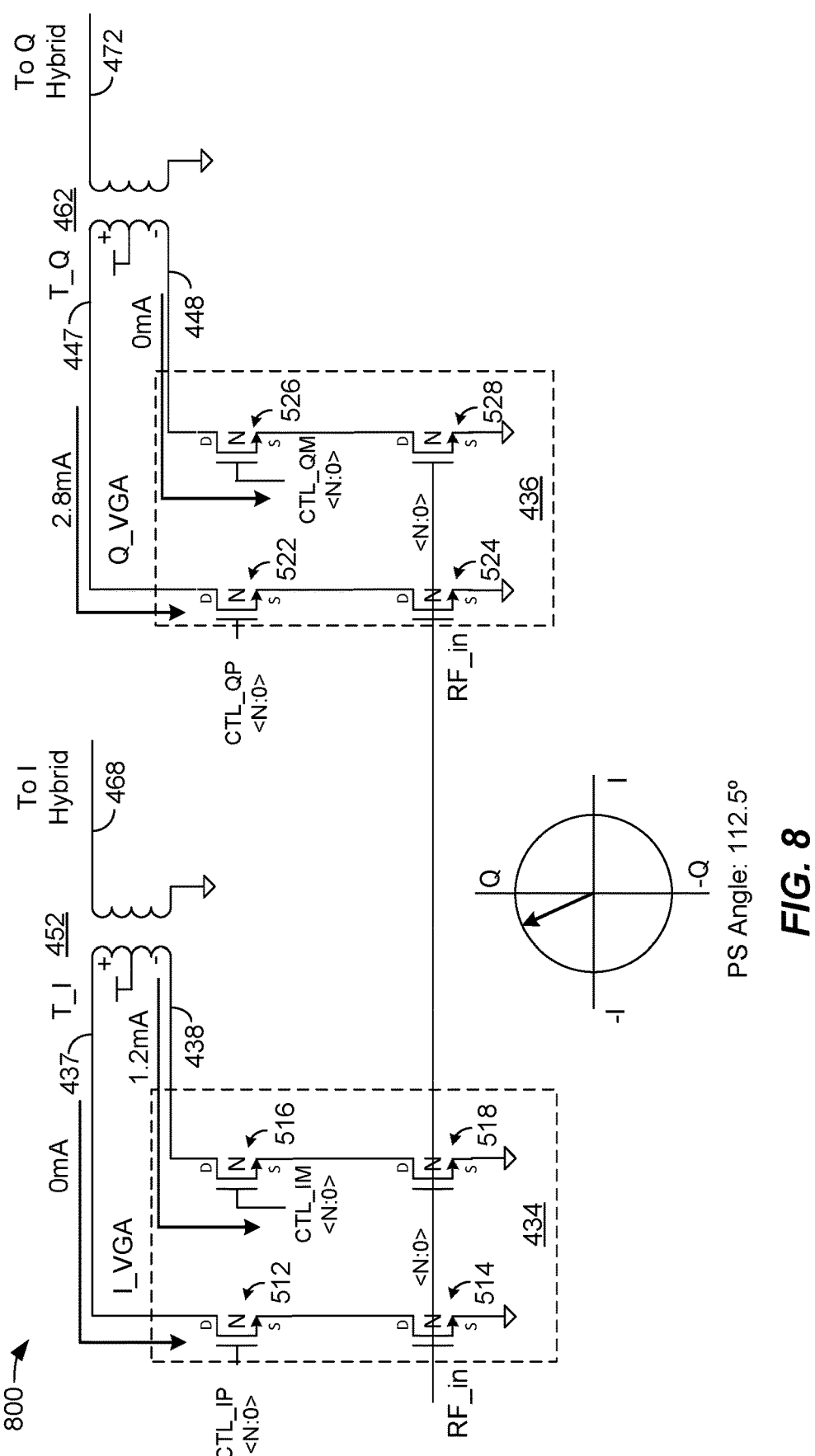
FIG. 8 is a diagram showing a detailed view of the portion of the phase shifter of FIG. 5 configured to generate a particular phase angle.

FIG. 8 is a diagram showing a detailed view of the portion of the phase shifter of FIG. 5 configured to generate a particular phase angle. In an exemplary embodiment, the circuit 800 is configured to provide a 112.5° phase angle using an RF input signal at a frequency of 27 GHZ. In the exemplary embodiment shown in FIG. 8, the control signals CTL_IP<N:0>, CTL_IM<N:0>, CTL_QP<N:0>, and CTL_QM<N:0> are provided to the transistors 512, 516, 522 and 526, respectively, such that there is an approximate 0 mA current flowing through the transistors 512 and 514 in the I VGA 434, an approximate 1.2 mA current flowing through the transistors 516 and 518 in the I VGA 434, an approximate 2.8 mA current flowing through the transistors 522 and 524 in the Q VGA 436 and an approximate 0 mA current flowing through the transistors 526 and 528 in the Q VGA 436. This arrangement results in signals on connections 468 and 472 that when combined by the HQG 474 (FIG. 4) result in a combined 112.5° phase signal at the output of the HQG 474 on connection 476 (FIG. 4).

Figure 9:
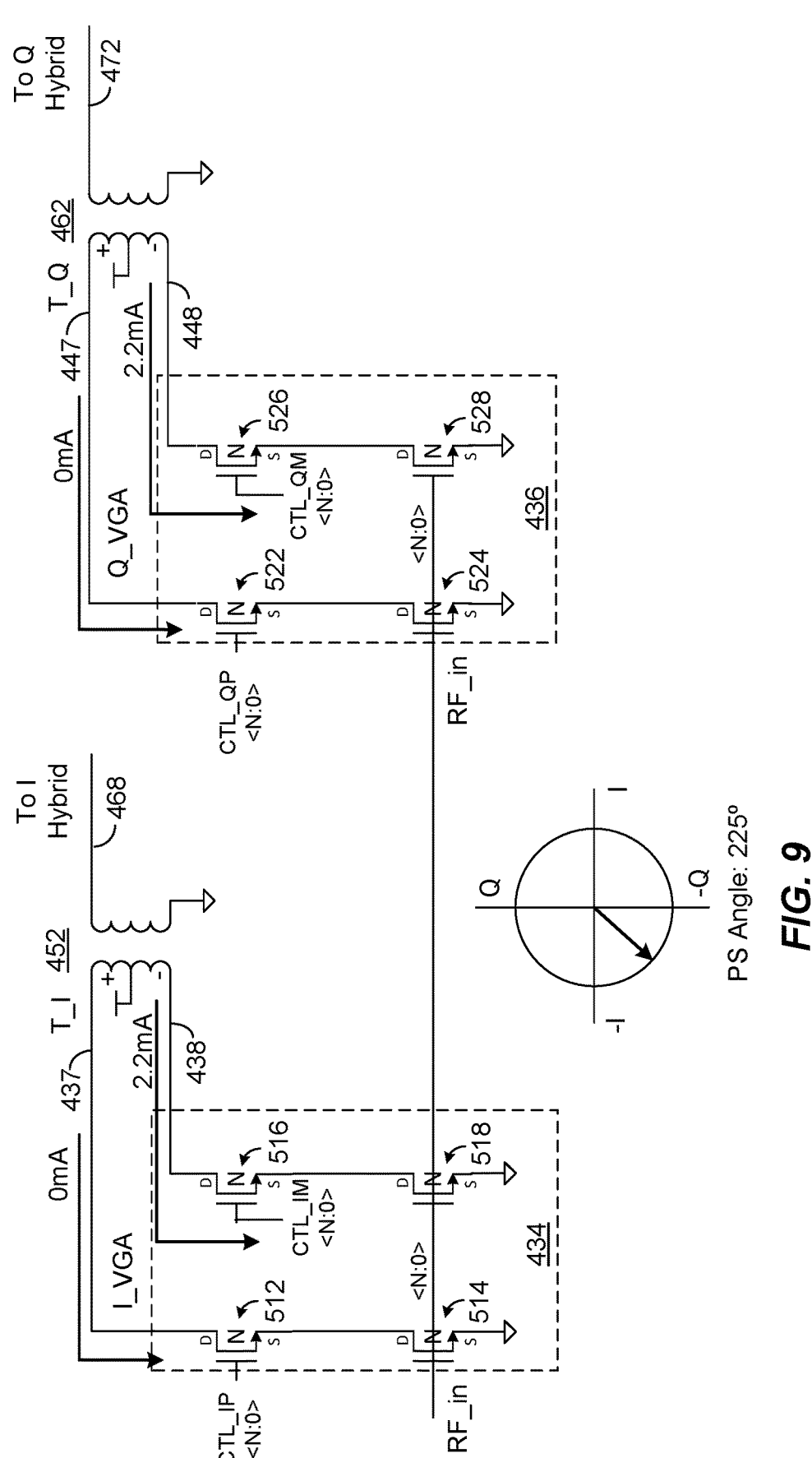
FIG. 9 is a diagram showing a detailed view of the portion of the phase shifter of FIG. 5 configured to generate a particular phase angle.

FIG. 9 is a diagram showing a detailed view of the portion of the phase shifter of FIG. 5 configured to generate a particular phase angle. In an exemplary embodiment, the circuit 900 is configured to provide a 225° phase angle using an RF input signal at a frequency of 27 GHZ. In the exemplary embodiment shown in FIG. 9, the control signals CTL_IP<N:0>, CTL_IM<N:0>, CTL_QP<N:0>, and CTL_QM<N:0> are provided to the transistors 512, 516, 522 and 526, respectively, such that there is an approximate 0 mA current flowing through the transistors 512 and 514 in the I VGA 434, an approximate 2.2 mA current flowing through the transistors 516 and 518 in the I VGA 434, an approximate 0 mA current flowing through the transistors 522 and 524 in the Q VGA 436 and an approximate 2.2 mA current flowing through the transistors 526 and 528 in the Q VGA 436. This arrangement results in signals on connections 468 and 472 that when combined by the HQG 474 (FIG. 4) result in a combined 225° phase signal at the output of the HQG 474 on connection 476 (FIG. 4).

Figure 10:
FIG. 10 is a block diagram of an alternative embodiment of the TX and RX elements of the phased array system of FIG. 3.

FIG. 10 is a block diagram 1000 of an alternative embodiment of the TX and RX elements of the phased array system of FIG. 3. The phased array system 1000 may be used to implement the phase shifter and HQG described herein for two elements of TX and RX, which may be included in the phase circuitry 281.

In an exemplary embodiment, a first element 1010 may comprise TX circuitry including a power amplifier (PA) 1012 and RX circuitry including a low noise amplifier (LNA) 1014. The first element 1010 also includes an iteration of the RX I/Q VGA 1015 (analogous to the VGA 432, FIG. 4), and a transformer 1052 (analogous to the transformer 452 of FIG. 4). The first element 1010 also includes a TX I/Q VGA 1016. The TX I/Q VGA 1016 may be similar to the RX I/Q VGA 1015 or the VGA 432 of FIG. 4.

A second element 1020 may comprise TX circuitry including a power amplifier (PA) 1022 and RX circuitry including a low noise amplifier (LNA) 1024. The second element 1020 also includes an iteration of the RX I/Q VGA 1025 (analogous to the VGA 442, FIG. 4), and a transformer 1062 (analogous to the transformer 462 of FIG. 4). The second element 1020 also includes a TX I/Q VGA 1026. The TX I/Q VGA 1026 may be similar to the RX I/Q VGA 1025 or the VGA 442 of FIG. 4.

The first element 1010 and the second element 1020 also share a connection network 1050 and a switching network 1075. The connection network 1050 may be similar to the connection network 450 of FIG. 4.

The switching network 1075 may be connected to the secondary sides of the transformers 1052 and 1062; and may be connected to a HQG 1074. The HQG 1074 may be similar to the HQG 474 of FIG. 4.

The HQG 1074 may be connected to a multiplexer (MUX) 1082, which may provide either a transmit (TX) signal input or a receive (RX) signal output.

Figure 11:
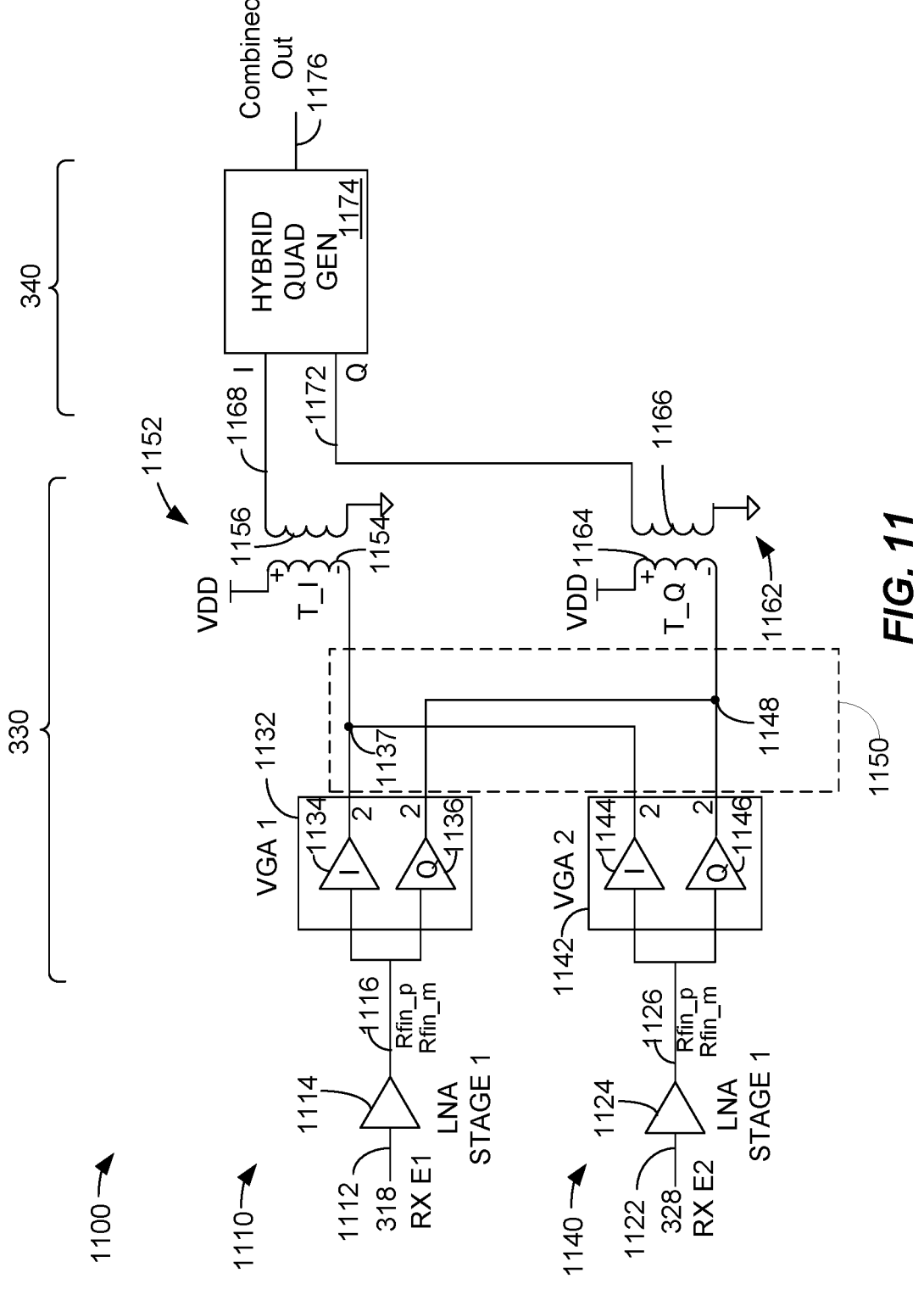
FIG. 11 is a block diagram of a circuit showing an alternative exemplary embodiment of the phase shifter of FIG. 4.

FIG. 11 is a block diagram of a circuit 1100 showing an alternative exemplary embodiment of the phase shifter of FIG. 4. Elements in FIG. 11 that are similar to elements in FIG. 4 will be referred to using the nomenclature 11XX, where an element in FIG. 11 labeled 11XX is analogous to an element in FIG. 4 labeled 4XX.

In an exemplary embodiment, the circuit 1100 may include a first signal path 1110 and a second signal path 1140. The first signal path 1110 may comprise a low noise amplifier 1114 and a variable gain amplifier (VGA) 1132, which may be an example of the VGA 1015. In an exemplary embodiment, the LNA 1114 may comprise a first stage LNA, and may be an example of the LNA 314 of FIG. 3. In an exemplary embodiment, the output of the LNA 1114 on connection 1116 may comprise differential RF input signals and the RF input signals may be referred to as RFin_p and RFin_m. The VGA 1132 may comprise a VGA 1134 configured to amplify signals for an in phase (I) component (I VGA) and a VGA 1136 configured to amplify signals for a quadrature (Q) component (Q VGA). Either the positive differential signal (RFin_p) or the negative differential signal (RFin_m) on connection 1116 may be selected and amplified by the VGA 1134 and the VGA 1136.

The second signal path 1140 may comprise a low noise amplifier 1124 and a variable gain amplifier (VGA) 1142. In an exemplary embodiment, the LNA 1124 may comprise a first stage LNA, and may be an example of the LNA 324 of FIG. 3. In an exemplary embodiment, the output of the LNA 1124 on connection 1126 may comprise differential RF input signals and the RF input signals may be referred to as RFin_p and RFin_m. The VGA 1142 may comprise a VGA 1144 configured to amplify signals for an in phase (I) component (I VGA) and a VGA 1146 configured to amplify signals for a quadrature (Q) component (Q VGA). Either the positive differential signal (RFin_p) or the negative differential signal (RFin_m) may be selected and amplified by the VGA 1144 and the VGA 1146.

In an exemplary embodiment, placing the VGAs 1132 and 1142 ahead of the HQG 1174 in the signal paths 1110 and 1140 allows the number of stages in the LNA to be reduced, thereby saving area while conserving the receiver noise figure. In an exemplary embodiment, the VGAs 1132 and 1142 perform amplification and vector modulation to effectively provide phase shift to the signals on connections 1116 and 1126 from the two separate signal paths 1110 and 1140.

In an exemplary embodiment, the output of the VGA 1132 and the output of the VGA 1142 is provided to a connection network 1150. The connection network 1150 may be any network capable of providing the I outputs of the I VGAs 1134 and 1144, and the Q outputs of the Q VGAs 1136 and 1146 to the transformers 1152 and 1162. For example, the two I outputs of the VGA 1134 are combined and the two I outputs of the VGA 1144 are combined and may be selectively provided to a node 1137. The node 1137 may be connected to one terminal of the primary side 1154 of the transformer 1152. The other terminal of the primary side 1154 of the transformer 1152 may be connected to a system voltage, VDD.

Similarly, the two Q outputs of the VGA 1136 are combined and the two Q outputs of the VGA 1146 are combined and may be selectively provided to a node 1148. The node 1148 may be connected to one terminal of the primary side 1164 of the transformer 1162. The other terminal of the primary side 1164 of the transformer 1162 may be connected to a system voltage, VDD.

As will be described in greater detail below, the outputs of the I VGA 1134 and the I VGA 1144 may be selectively controlled by controlling the current flow through the I VGA 1134 and the I VGA 1144. Similarly, the outputs of the Q VGA 1136 and the Q VGA 1146 may be selectively controlled by controlling the current flow through the Q VGA 1136 and the Q VGA 1146.

In an exemplary embodiment, the transformer 1152 may be configured to receive the in phase (I) signals and includes the primary side 1154 and a secondary side 1156. In an exemplary embodiment, the transformer 1162 may be configured to receive the quadrature (Q) signals and includes the primary side 1164 and a secondary side 1166.

The primary side 1154 and the primary side 1164 may be configured to receive positive or negative signals and the secondary side 1156 and the secondary side 1166 are single-ended. In the exemplary embodiment shown in FIG. 11, the I outputs of the VGAs 1134 and 1144 are connected to the negative terminal of the primary side 1154 and the Q outputs of the VGAs 1136 and 1146 are connected to the negative terminal of the primary side 1164, although other configurations are possible.

An I output of the transformer 1152 may be provided to the HQG 1174 over connection 1168 and the Q output of the transformer 1162 may be provided to the HQG 1174 over connection 1172. The output of the HQG 1174 on connection 1176 is a combined output at a desired phase.

Figure 12:
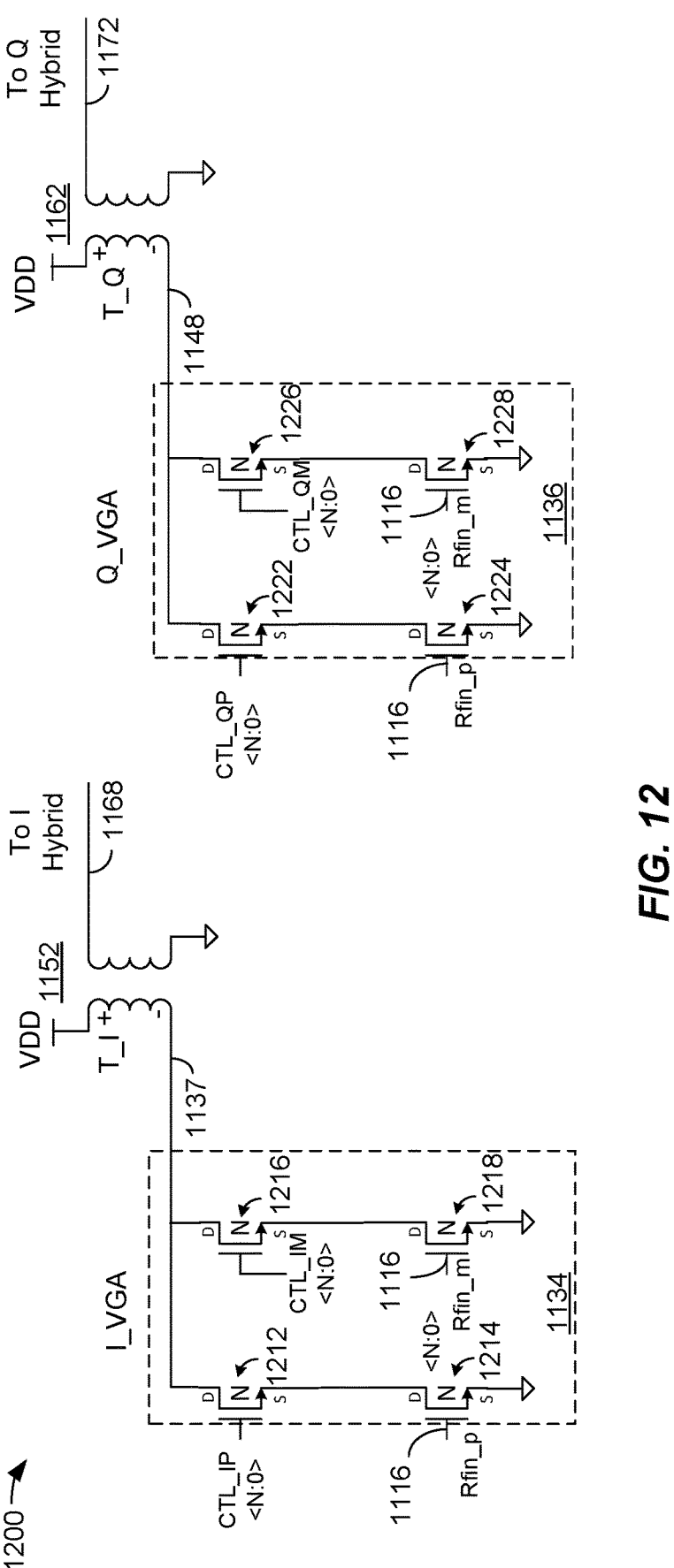
FIG. 12 is a diagram showing a detailed view of a portion of the phase shifter of FIG. 3 and FIG. 11.

FIG. 12 is a diagram showing a detailed view of a portion of the phase shifter 330 of FIG. 3 and FIG. 11. In an exemplary embodiment, the circuit 1200 includes the I VGA 1134 and the Q VGA 1136 of FIG. 11. A similar circuit would include the I VGA 1144 and the Q VGA 1146 of FIG. 11, but is omitted for clarity. In an exemplary embodiment, the I VGA 1134 may comprise transistors 1212 and 1214; and transistors 1216 and 1218. In an exemplary embodiment, the Q VGA 1136 may comprise transistors 1222 and 1224; and transistors 1226 and 1228. In an exemplary embodiment, the I VGA 1134 and the Q VGA 1136 may comprise multiple (e.g., N+1) iterations, or slices, each having the structure shown. The reference <N:0> refers to the array of iterations or slices of each of the I VGA 1134 and the Q VGA 1136.

In an exemplary embodiment, the transistors 1212 and 1214 may be arranged in a cascode architecture where the transistor 1214 is configured to receive the RF input signal, RFin_p (1116), and the transistor 1212 is configured as the cascode transistor. The transistor 1212 is configured to receive a control signal, CTL_IP<N:0> at its gate. Similarly, the transistors 1216 and 1218 may be arranged in a cascode architecture where the transistor 1218 is configured to receive the RF input signal, RFin_m (1116), and the transistor 1216 is configured as the cascode transistor. The transistor 1216 is configured to receive a control signal, CTL_IM<N:0> at its gate.

In an exemplary embodiment, the transistors 1222 and 1224 may be arranged in a cascode architecture where the transistor 1224 is configured to receive the RF input signal, RFin_p (1116), and the transistor 1222 is configured as the cascode transistor. The transistor 1222 is configured to receive a control signal, CTL_QP<N:0> at its gate. Similarly, the transistors 1226 and 1228 may be arranged in a cascode architecture where the transistor 1228 is configured to receive the RF input signal, RFin_m (1116), and the transistor 1226 is configured as the cascode transistor. The transistor 1226 is configured to receive a control signal, CTL_QM<N:0> at its gate. The control signals CTL_IP<N:0>, CTL_IM<N:0>, CTL_QP<N:0>, and CTL_QM<N:0> may be provided by the data processor 210 or another controller. In an exemplary embodiment, the control signals CTL_IP<N:0>, CTL_IM<N:0> determine, or set, the amount of current flowing through the primary side of the transformer 1152; and the control signals CTL_QP<N:0>, and CTL_QM<N:0> determine, or set, the amount of current flowing through the primary side of the transformer 1162. In an exemplary embodiment, the amount of current flowing through the primary sides of the transformers 1152 and 1162 can be used to determine, or set, the phase of the signals appearing at the secondary sides of the transformers 1152 and 1162 on connections 1168 and 1172, respectively. In an exemplary embodiment, the control signals CTL_IP<N:0>, CTL_IM<N:0> allow current to be steered through the I VGA 1134 connected to the terminal side of the primary side of the transformer 1152 and the control signals CTL_QP<N:0>, and CTL_QM<N:0> allow current to be steered through the Q VGA 1136 connected to the negative terminal of the primary side of the transformer 1162. Selectively steering the current through the I VGA 1134 and the Q VGA 1136 provides 0/180 and 90/270 degree phase shifts respectively, thus allowing phase angle adjustments ranging from 0° to 360°. The secondary sides of the transformers 1152 and 1162 are single ended. The transformers 1152 and 1162 also provide current-to-voltage combining for the two signal paths 1110 and 1140 (FIG. 11).

Figure 13:
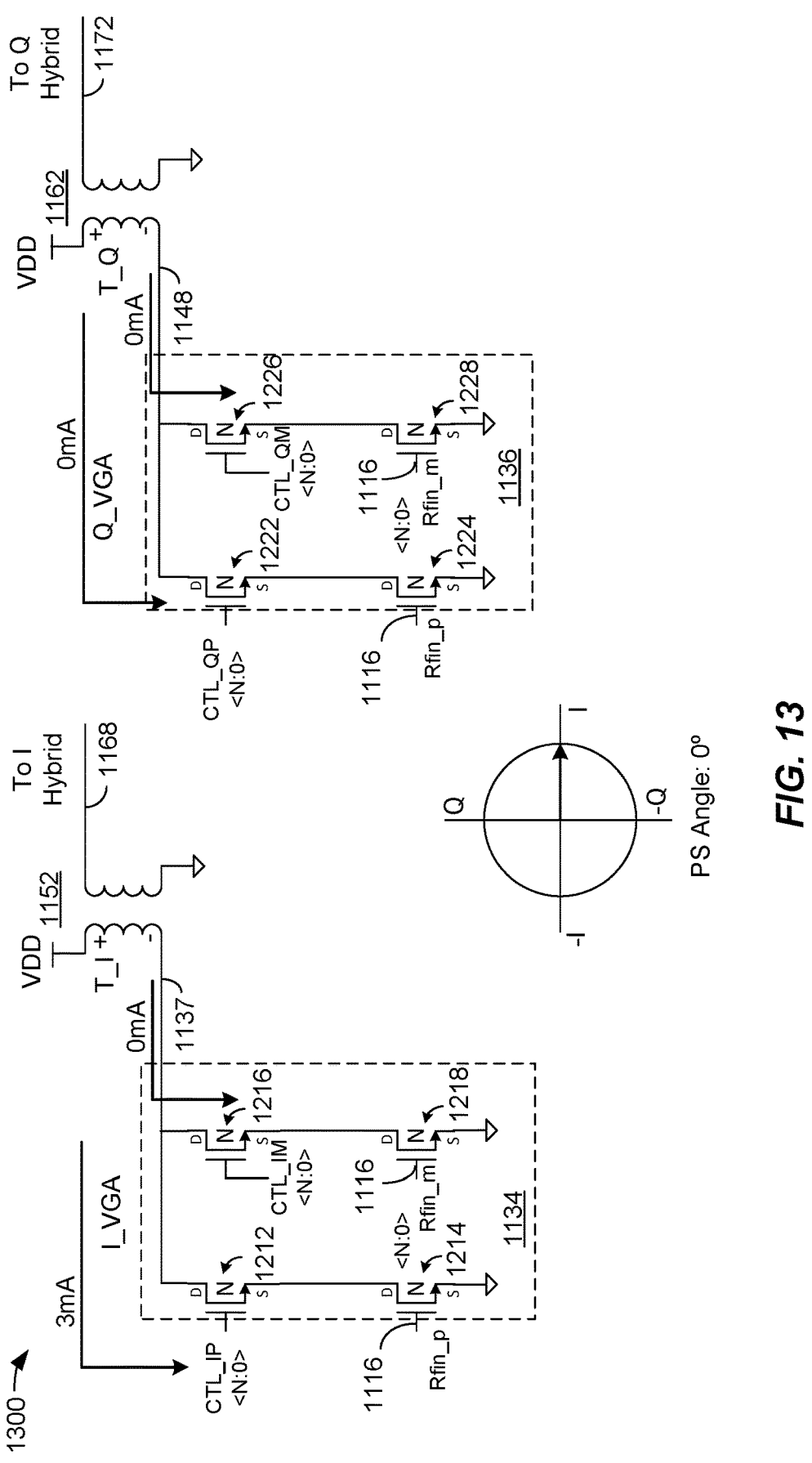
FIG. 13 is a diagram showing a detailed view of the portion of the phase shifter of FIG. 12 configured to generate a particular phase angle.

FIG. 13 is a diagram showing a detailed view of the portion of the phase shifter of FIG. 12 configured to generate a particular phase angle. In an exemplary embodiment, the circuit 1300 is configured to provide a 0° phase angle using an RF input signal at a frequency of 27 GHz. In the exemplary embodiment shown in FIG. 13, the control signals CTL_IP<N:0>, CTL_IM<N:0>, CTL_QP<N:0>, and CTL_QM<N:0> are provided to the transistors 1212, 1216, 1222 and 1226, respectively, such that there is an approximate 3 mA current flowing through the transistors 1212 and 1214 of the I VGA 1134, an approximate 0 mA current flowing through the transistors 1216 and 1218 of the I VGA 1134, an approximate 0 mA current flowing through the transistors 1222 and 1224 of the Q VGA 1136 and an approximate 0 mA current flowing through the transistors 1226 and 1228 of the Q VGA 1146. This arrangement results in signals on connections 1168 and 1172 that when combined by the HQG 1174 (FIG. 11) result in a combined 0° phase signal at the output of the HQG 1174 on connection 1176 (FIG. 11).

Figure 14:
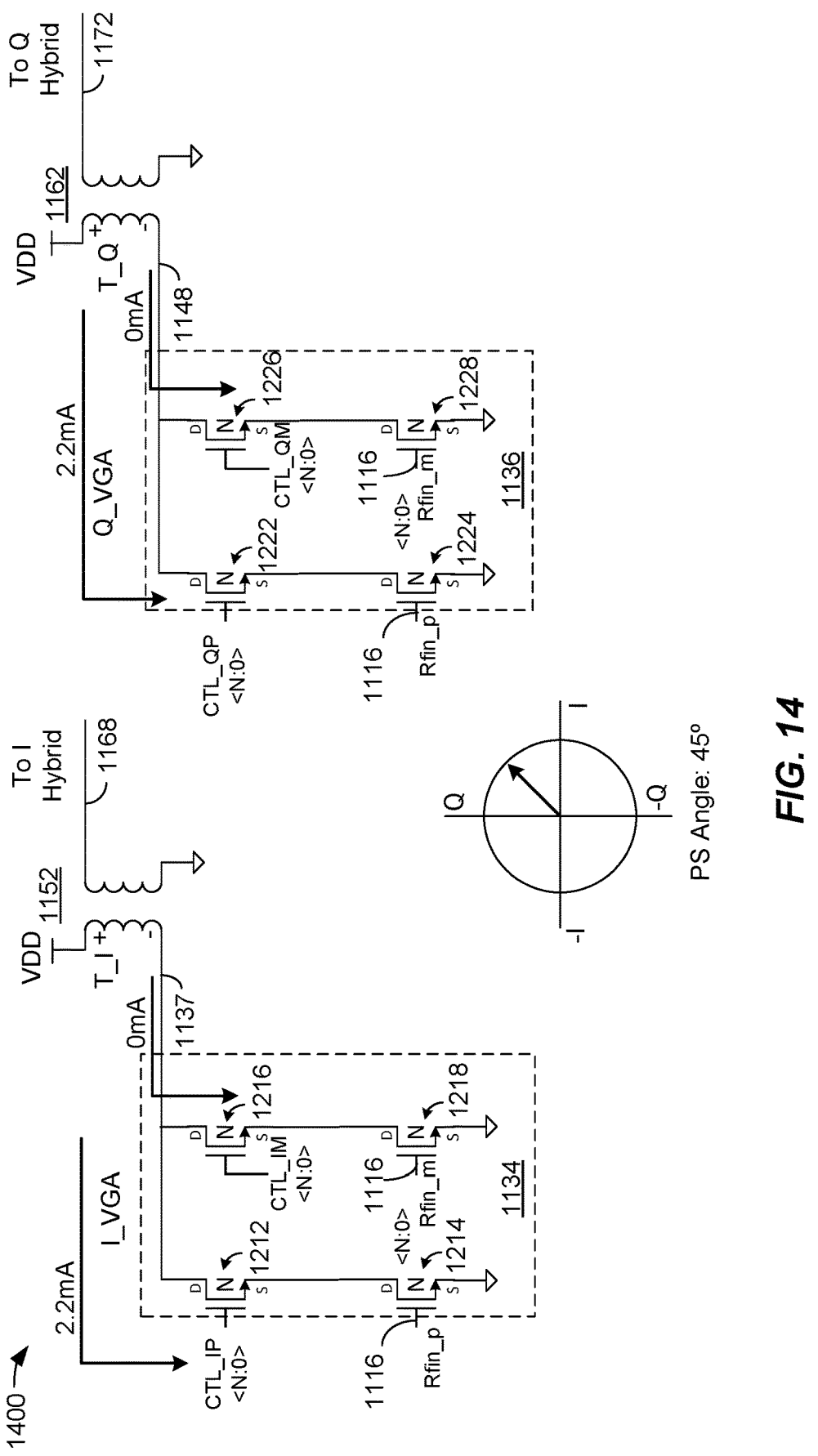
FIG. 14 is a diagram showing a detailed view of the portion of the phase shifter of FIG. 12 configured to generate a particular phase angle.

FIG. 14 is a diagram showing a detailed view of the portion of the phase shifter of FIG. 12 configured to generate a particular phase angle. In an exemplary embodiment, the circuit 1400 is configured to provide a 45° phase angle using an RF input signal at a frequency of 27 GHz. In the exemplary embodiment shown in FIG. 14, the control signals CTL_IP<N:0>, CTL_IM<N:0>, CTL_QP<N:0>, and CTL_QM<N:0> are provided to the transistors 1212, 1216, 1222 and 1226, respectively, such that there is an approximate 2.2 mA current flowing through the transistors 1212 and 1214 of the I VGA 1134, an approximate 0 mA current flowing through the transistors 1216 and 1218 of the I VGA 1134, an approximate 2.2 mA current flowing through the transistors 1222 and 1224 of the Q VGA 1136 and an approximate 0 mA current flowing through the transistors 1226 and 1228 of the Q VGA 1136. This arrangement results in signals on connections 1168 and 1172 that when combined by the HQG 1174 (FIG. 11) result in a combined 45° phase signal at the output of the HQG 1174 on connection 1176 (FIG. 11).

Figure 15:
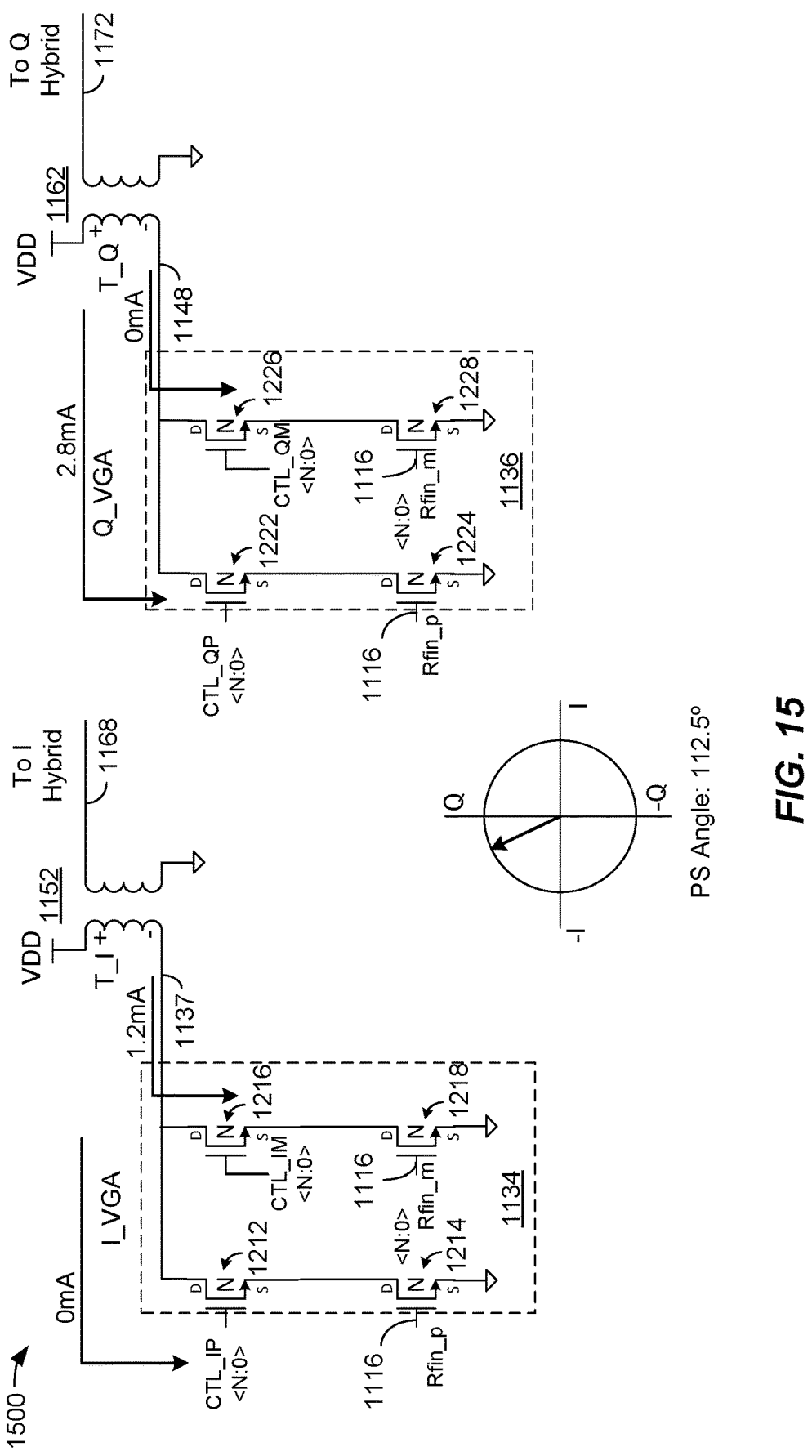
FIG. 15 is a diagram showing a detailed view of the portion of the phase shifter of FIG. 12 configured to generate a particular phase angle.

FIG. 15 is a diagram showing a detailed view of the portion of the phase shifter of FIG. 12 configured to generate a particular phase angle. In an exemplary embodiment, the circuit 1500 is configured to provide a 112.5° phase angle using an RF input signal at a frequency of 27 GHz. In the exemplary embodiment shown in FIG. 15, the control signals CTL_IP<N:0>, CTL_IM<N:0>, CTL_QP<N:0>, and CTL_QM<N:0> are provided to the transistors 1212, 1216, 1222 and 1226, respectively, such that there is an approximate 0 mA current flowing through the transistors 1212 and 1214 of the I VGA 1134, an approximate 1.2 mA current flowing through the transistors 1216 and 1218 of the I VGA 1134, an approximate 2.8 mA current flowing through the transistors 1222 and 1224 of the Q VGA 1136 and an approximate 0 mA current flowing through the transistors 1226 and 1228 of the Q VGA 11436. This arrangement results in signals on connections 1168 and 1172 that when combined by the HQG 1174 (FIG. 11) result in a combined 112.5° phase signal at the output of the HQG 1174 on connection 1176 (FIG. 11).

Figure 16:
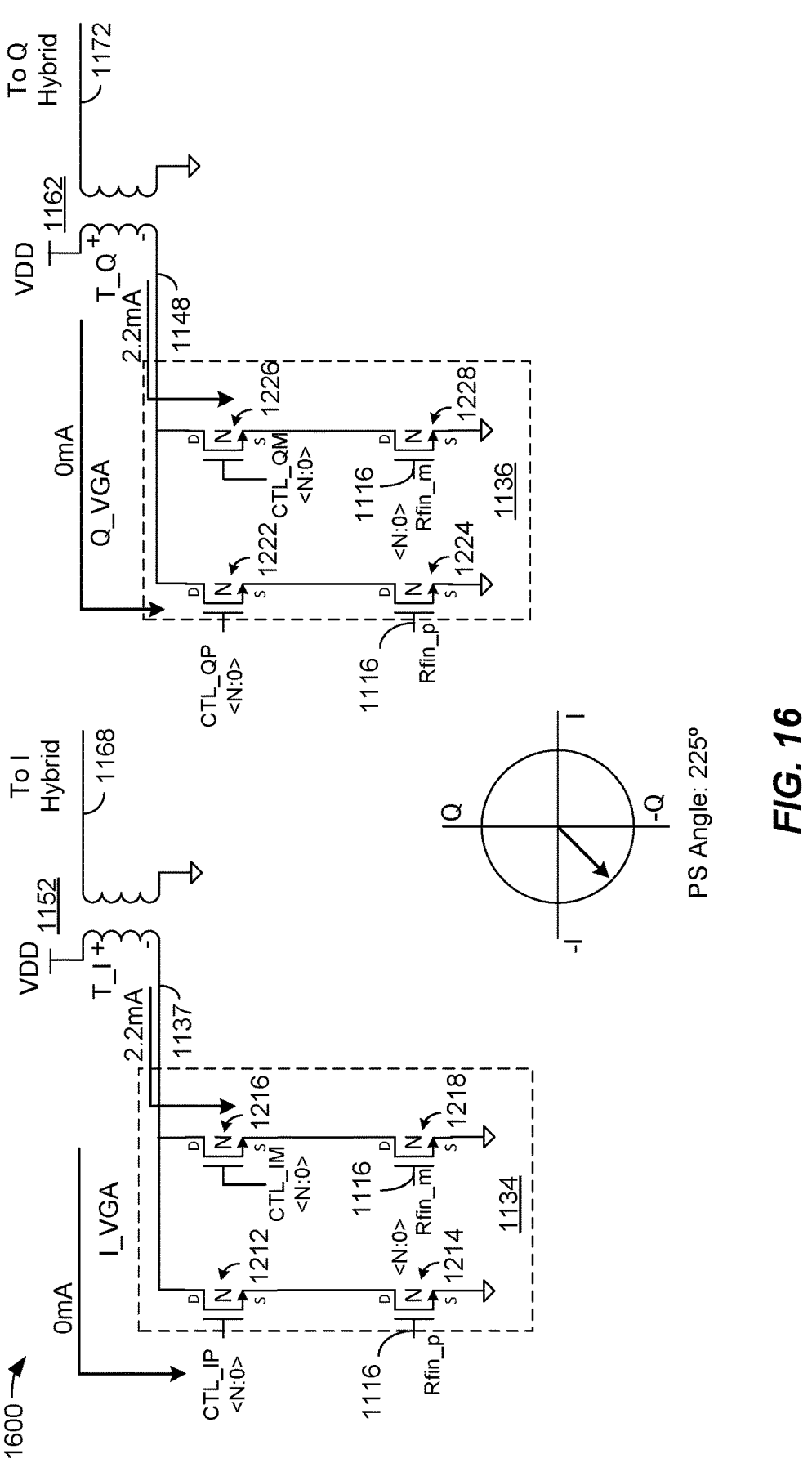
FIG. 16 is a diagram showing a detailed view of the portion of the phase shifter of FIG. 12 configured to generate a particular phase angle.

FIG. 16 is a diagram showing a detailed view of the portion of the phase shifter of FIG. 12 configured to generate a particular phase angle. In an exemplary embodiment, the circuit 1600 is configured to provide a 225° phase angle using an RF input signal at a frequency of 27 GHz. In the exemplary embodiment shown in FIG. 16, the control signals CTL_IP<N:0>, CTL_IM<N:0>, CTL_QP<N:0>, and CTL_QM<N:0> are provided to the transistors 1212, 1216, 1222 and 1226, respectively, such that there is an approximate 0 mA current flowing through the transistors 1212 and 1214 of the I VGA 1134, an approximate 2.2 mA current flowing through the transistors 1216 and 1218 of the I VGA 1134, an approximate 0 mA current flowing through the transistors 1222 and 1224 of the Q VGA 1136 and an approximate 2.2 mA current flowing through the transistors 1226 and 1228 of the Q VGA 1136. This arrangement results in signals on connections 1168 and 1172 that when combined by the HQG 1174 (FIG. 11) result in a combined 225° phase signal at the output of the HQG 1174 on connection 1176 (FIG. 11).

Figure 17:
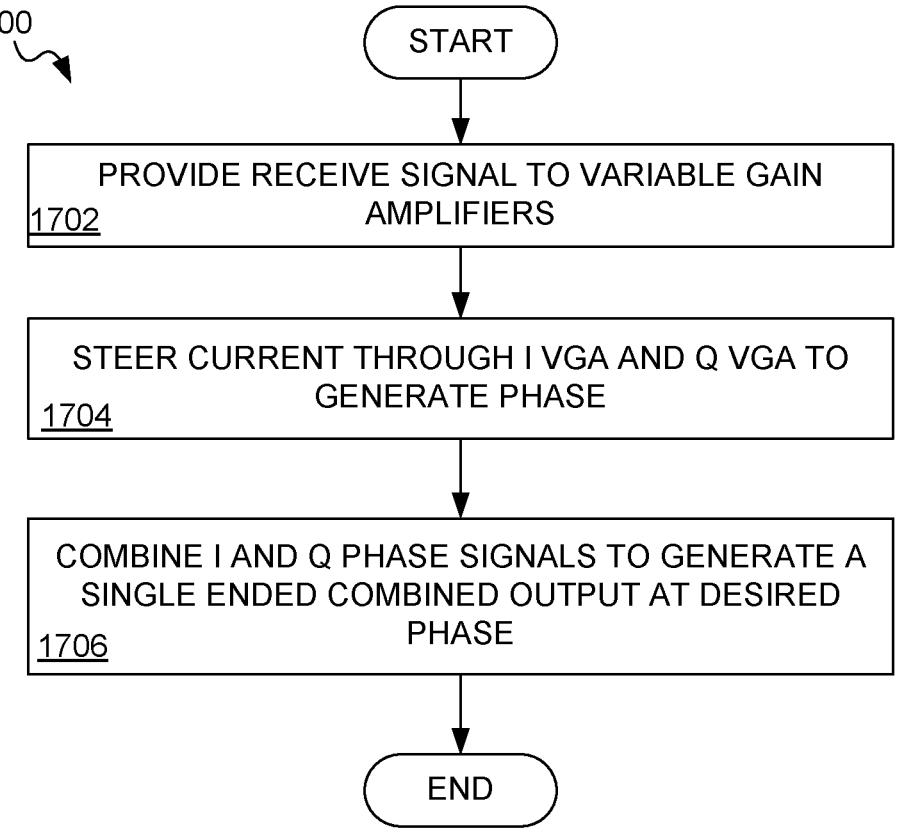
FIG. 17 is a flow chart describing an example of the operation of a method for phase shifting signals.

FIG. 17 is a flow chart 1700 describing an example of the operation of a method for phase shifting signals. The blocks in the method 1700 can be performed in or out of the order shown, and in some embodiments, can be performed at least in part in parallel.

In block 1702, receive signals are provided to variable gain amplifiers. For example, RF signals are provided over connection 416 to the I VGA 434 and to the Q VGA 436. Similarly, RF signals are provided over connection 426 to the I VGA 444 and to the Q VGA 446.

In block 1704, currents are steered through the I VGAs and the Q VGAs to generate in phase and quadrature signals. For example, the control signals CTL_IP<N:0>, CTL_IM<N:0>, CTL_QP<N:0>, and CTL_QM<N:0> are provided to the transistors 512, 516, 522 and 526, respectively, such that current is steered to the primary sides of the transformers 452 and 462.

In block 1706, the in phase and quadrature signals are combined to generate a single-ended output at a desired phase. For example, the I output of the transformer 452 on connection 468, and the Q output of the transformer 462 on connection 472 are combined in the HQG 474 and provided on connection 476 as a combined single-ended output at a desired phase. The I output of the transformer 452 on connection 468 may be single-ended, and the Q output of the transformer 462 on connection 472 may be single-ended.

Figure 18:
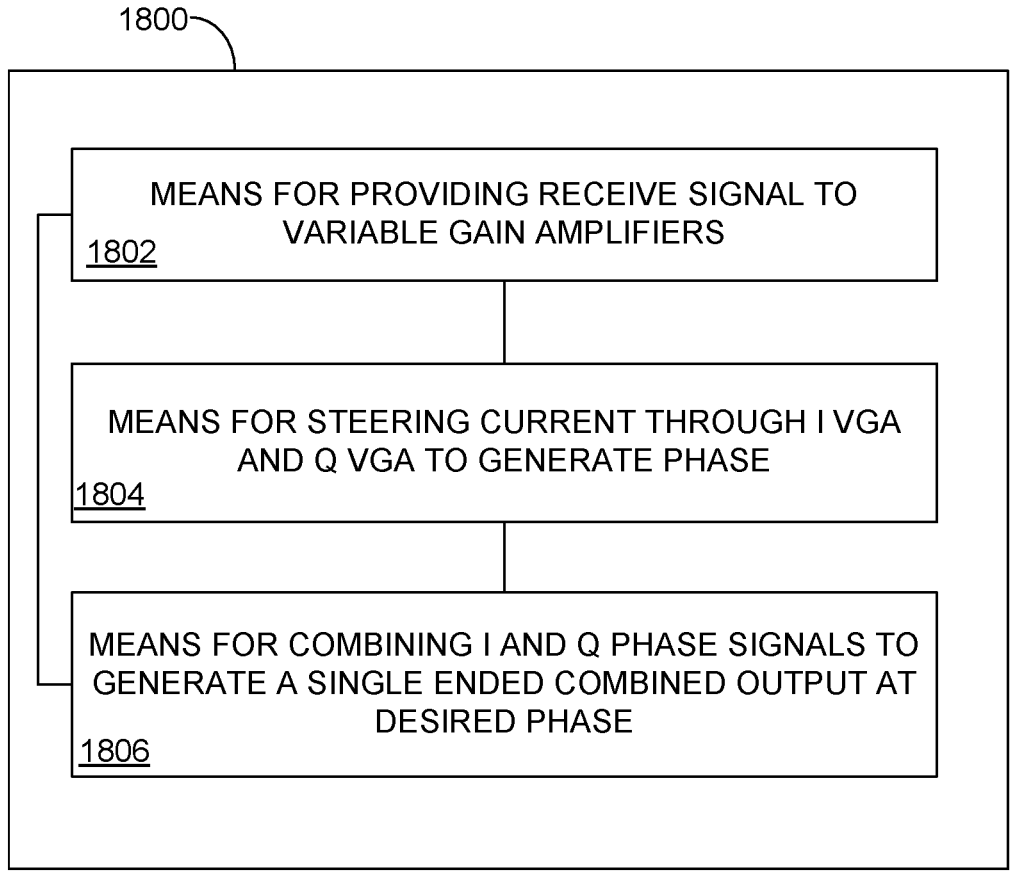
FIG. 18 is a functional block diagram of an apparatus for phase shifting signals.

FIG. 18 is a functional block diagram of an apparatus 1800 for phase shifting signals. The apparatus 1800 comprises means 1802 for providing receive signals to variable gain amplifiers. In certain embodiments, the means 1802 for providing receive signals to variable gain amplifiers can be configured to perform one or more of the functions described in operation block 1702 of method 1700 (FIG. 17). In an exemplary embodiment, the means 1802 for providing receive signals to variable gain amplifiers may comprise components (e.g., LNAs 414, 424) that provide RF signals over connection 416 to the I VGA 434 and to the Q VGA 436; and provide RF signals over connection 426 to the I VGA 444 and to the Q VGA 446.

The apparatus 1800 may also comprise means 1804 for steering currents through the I VGAs and the Q VGAs to generate in phase and quadrature signals. In certain embodiments, the means 1804 for steering currents through the I VGAs and the Q VGAs to generate phase can be configured to perform one or more of the functions described in operation block 1704 of method 1700 (FIG. 17). In an exemplary embodiment, the means 1804 for steering currents through the I VGAs and the Q VGAs to generate in phase and quadrature signals may comprise the control signals CTL_IP<N:0>, CTL_IM<N:0>, CTL_QP<N:0>, and CTL_QM<N:0> and/or the transistors 512, 516, 522 and 526, which may steer current to the primary sides of the transformers 452 and 462. In some examples, the outputs of the transformers 452 and 462 are single-ended.

The apparatus 1800 may also comprise means 1806 for combining the in phase and quadrature signals to generate a single-ended output at a desired phase.

In certain embodiments, the means 1806 for combining in phase and quadrature signals to generate a single-ended output at a desired phase can be configured to perform one or more of the functions described in operation block 1706 of method 1700 (FIG. 17). In an exemplary embodiment, the means 1806 for combining in phase and quadrature signals to generate a single-ended output at a desired phase may comprise the HQG 474, which may be configured to combine the I output of the transformer 452 on connection 468, and the Q output of the transformer 462 on connection 472 and provide on connection 476 a combined output at a desired phase. Thus, in some examples, the inputs to the means 1806 may be single-ended.

Implementation examples are described in the following numbered clauses:

1. A phase shifter for a millimeter wave (mmW) communication system, comprising: an in phase variable gain amplifier (I VGA) and a quadrature VGA (Q VGA) configured to receive radio frequency (RF) signals, the I VGA and the Q VGA configured to provide a selectable output to primary sides of first and second electromagnetic (EM) elements, respectively, the first EM element configured to provide a single-ended I output and the second EM element configured to provide a single-ended Q output; and a hybrid quadrature generator (HQG) configured to receive the single-ended I output of the first EM element and the single-ended Q output of the second EM element, the HQG configured to provide a combined signal at a desired phase.

2. The communication system of clause 1, wherein the combined signal is a single-ended signal.

3. The communication system of clause 1 or 2, wherein the selectable output provided by the I VGA and the Q VGA is configured to control a current flow through the primary side of the first EM element and the primary side of the second EM element.

4. The communication system of any of clauses 1 through 3, wherein the I VGA and the Q VGA are configured to select the current flow through the primary side of the first EM element and the primary side of the second EM element to vary a phase of a signal at a secondary side of the first EM element and vary a phase of a signal at a secondary side of the second EM element.

5. The communication system of clause 4, wherein the I VGA and to the Q VGA are configured to receive single-ended RF input signals and configured to provide pseudo-differential outputs.

6. The communication system of clause 5, wherein the I VGA and Q VGA are configured to provide an output to one of a positive terminal or a negative terminal of the primary side of the first EM element and an output to one of a positive terminal or a negative terminal of the primary side of the second EM element, respectively.

7. The communication system of any of clauses 1 through 6, wherein the I VGA and to the Q VGA are configured to receive differential RF input signals.

8. The communication system of clause 7, wherein a positive terminal of the primary side of the first EM element and a positive terminal of the primary side of the second EM element are connected to system voltage and a negative terminal of the primary side of the first EM element is coupled to an output of the I VGA and a negative terminal of the primary side of the second EM element is coupled to an output of the Q VGA.

9. A method for phase shifting signals, comprising: providing radio frequency (RF) receive signals to an in phase variable gain amplifier (I VGA) and to a quadrature variable gain amplifier (Q VGA); steering current through the I VGA and the Q VGA to generate in phase and quadrature signals; and combining the in phase and quadrature signals from the I VGA and the Q VGA to generate a single-ended combined signal at a desired phase.

10. The method of clause 9, wherein steering current through the I VGA and the Q VGA further comprises: steering current through a first I VGA and steering current through a second I VGA; and steering current through a first Q VGA and steering current through a second Q VGA.

11. The method of clause 9 or 10, wherein steering current through the I VGA and the Q VGA comprises selecting a current flow through a primary side of a first EM element and selecting a current flow through a primary side of a second EM element to vary a phase of a signal at a secondary side of the first EM element and vary a phase of a signal at a secondary side of the second EM element.

12. The method of any of clauses 9 through 11, wherein the RF receive signals comprise single-ended RF input signals provided to the I VGA and to the Q VGA and the I VGA and the Q VGA provide pseudo-differential outputs.

13. The method of clause 12, further comprising: providing a pseudo-differential output of the I VGA to one of a positive terminal or a negative terminal of a primary side of the first EM element; and providing a pseudo-differential output of the Q VGA to one of a positive terminal or a negative terminal of a primary side of the second EM element.

14. The method of any of clauses 9 through 13, wherein the RF receive signals comprise differential RF input signals provided to the I VGA and to the Q VGA and the I VGA and the Q VGA provide differential outputs.

15. The method of clause 14, further comprising: providing the differential output of the I VGA to a negative terminal of the primary side of a first EM element; and providing the differential output of the Q VGA to a negative terminal of a primary side of a second EM element.

16. A device for signal phase shifting, comprising: means for providing radio frequency (RF) receive signals to an in phase variable gain amplifier (I VGA) and to a quadrature variable gain amplifier (Q VGA); means for steering current through the I VGA and the Q VGA to generate in phase and quadrature signals; and means for combining the in phase and quadrature signals from the I VGA and the Q VGA to generate a single-ended combined signal at a desired phase.

17. The device of clause 16, wherein the means for steering current through the I VGA and the Q VGA further comprises: means for steering current through a first I VGA and steering current through a second I VGA; and means for steering current through a first Q VGA and steering current through a second Q VGA.

18. The device of clause 16 or 17, wherein the means for steering current through the I VGA and the Q VGA comprises: means for selecting a current flow through a primary side of a first EM element and means for selecting a current flow through a primary side of a second EM element to vary a phase of a signal at a secondary side of the first EM element and vary a phase of a signal at a secondary side of the second EM element.

19. The device of any of clauses 16 through 18, wherein the RF receive signals comprise single-ended RF input signals provided to the I VGA and to the Q VGA and the I VGA and the Q VGA provide pseudo-differential outputs.

20. The device of clause 19, further comprising: means for providing a pseudo-differential output of the I VGA to one of a positive terminal or a negative terminal of a primary side of the first EM element; and means for providing a pseudo-differential output of the Q VGA to one of a positive terminal or a negative terminal of a primary side of the second EM element.

21. The device of any of clauses 16 through 20, wherein the RF receive signals comprise differential RF input signals provided to the I VGA and to the Q VGA and the I VGA and the Q VGA provide differential outputs.

22. The device of clause 21, further comprising: means for providing the differential output of the I VGA to a negative terminal of the primary side of a first EM element; and means for providing the differential output of the Q VGA to a negative side of a primary terminal of a second EM element.

23. A communication system having a phase shifter, comprising: a plurality of communication paths configured to carry a corresponding plurality of radio frequency (RF) communication signals; a first of the plurality of communication paths having a first in phase variable gain amplifier (I VGA) and a first quadrature VGA (Q VGA); a second of the plurality of communication paths having a second I VGA and a second Q VGA; the first I VGA and the second I VGA coupled to a primary side of a first electromagnetic (EM) element, the first EM element configured to provide a single ended I output; the first Q VGA and the second Q VGA coupled to a primary side of a second EM element, the second EM element configured to provide a single ended Q output; and a hybrid quadrature generator (HQG) configured to receive the single-ended I output of the first EM element and the single-ended Q output of the second EM element, the HQG configured to provide a combined signal.

24. The system of clause 23, wherein I VGA and the Q VGA of each of the plurality of communication paths are configured to provide selectable outputs to control a current flow through the primary side of the first EM element and the primary side of the second EM element.

25. The system of clause 23 or 24, wherein the I VGA and to the Q VGA of each of the communication paths are configured to receive single-ended RF input signals and output pseudo-differential signals.

26. The system of any of clauses 23 through 25, wherein each of the I VGA and the Q VGA of each of the plurality of communication paths are configured such that one of a positive terminal or a negative terminal of the primary side of the first EM element and one of a positive terminal or a negative terminal of the primary side of the second EM element receive an output of the I VGA and the Q VGA.

27. The system of any of clauses 23 through 26, wherein the I VGA and to the Q VGA of each of the plurality of communication paths are configured to receive a differential RF input signal, and wherein a positive terminal of the primary side of the first EM element and a positive terminal of the primary side of the second EM element is connected to system voltage and a negative terminal of the primary side of the first EM element receives an output of the I VGA of each of the plurality of communication paths and a negative terminal of the primary side of the second EM element receives an output of the Q VGA of each of the communication paths.

The circuit architecture described herein described herein may be implemented on one or more ICs, analog ICs, RFICs, mixed-signal ICs, ASICs, printed circuit boards (PCBs), electronic devices, etc. The circuit architecture described herein may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

Although selected aspects have been illustrated and described in detail, it will be understood that various substitutions and alterations may be made therein without departing from the spirit and scope of the present invention, as defined by the following claims.

What is claimed is:

1. A phase shifter for a millimeter wave (mmW) communication system, comprising:
   an in phase variable gain amplifier (I VGA) and a quadrature VGA (Q VGA) configured to receive radio frequency (RF) signals, the I VGA and the Q VGA configured to provide a selectable output to primary sides of first and second electromagnetic (EM) elements, respectively, the first EM element configured to provide a single-ended I output and the second EM element configured to provide a single-ended Q output;
   a hybrid quadrature generator (HQG) configured to receive the single-ended I output of the first EM element and the single-ended Q output of the second EM element, the HQG configured to provide a combined signal at a desired phase; and
   wherein the I VGA and the Q VGA are configured to receive differential RF input signals and wherein a positive terminal of the primary side of the first EM element and a positive terminal of the primary side of the second EM element are connected to system voltage and a negative terminal of the primary side of the first EM element is coupled to an output of the I VGA and a negative terminal of the primary side of the second EM element is coupled to an output of the Q VGA.

2. The communication system of claim 1, wherein the combined signal is a single-ended signal.

3. The communication system of claim 1, wherein the selectable output provided by the I VGA and the Q VGA is configured to control a current flow through the primary side of the first EM element and the primary side of the second EM element.

4. The communication system of claim 3, wherein the I VGA and the Q VGA are configured to select the current flow through the primary side of the first EM element and the primary side of the second EM element to vary a phase of a signal at a secondary side of the first EM element and vary a phase of a signal at a secondary side of the second EM element.

5. A method for phase shifting signals, comprising:
   providing radio frequency (RF) receive signals to an in phase variable gain amplifier (I VGA) and to a quadrature variable gain amplifier (Q VGA);

steering current through the I VGA and the Q VGA to generate in phase and quadrature signals;

combining the in phase and quadrature signals from the I VGA and the Q VGA to generate a single-ended combined signal at a desired phase;

steering current through a first I VGA and steering current through a second I VGA; and steering current through a first Q VGA and steering current through a second Q VGA.

6. The method of claim 5, wherein steering current through the I VGA and the Q VGA comprises selecting a current flow through a primary side of a first EM element and selecting a current flow through a primary side of a second EM element to vary a phase of a signal at a secondary side of the first EM element and vary a phase of a signal at a secondary side of the second EM element.

7. The method of claim 5, wherein the RF receive signals comprise single-ended RF input signals provided to the I VGA and to the Q VGA and the I VGA and the Q VGA provide pseudo-differential outputs.

8. The method of claim 7, further comprising:

providing a pseudo-differential output of the I VGA to one of a positive terminal or a negative terminal of a primary side of the first EM element; and providing a pseudo-differential output of the Q VGA to one of a positive terminal or a negative terminal of a primary side of the second EM element.

9. The method of claim 5, wherein the RF receive signals comprise differential RF input signals provided to the I VGA and to the Q VGA and the I VGA and the Q VGA provide differential outputs.

10. The method of claim 9, further comprising:

providing the differential output of the I VGA to a negative terminal of the primary side of a first EM element; and providing the differential output of the Q VGA to a negative terminal of a primary side of a second EM element.

11. A device for signal phase shifting, comprising:

means for providing radio frequency (RF) receive signals to an in phase variable gain amplifier (I VGA) and to a quadrature variable gain amplifier (Q VGA);

means for steering current through the I VGA and the Q VGA to generate in phase and quadrature signals;

means for combining the in phase and quadrature signals from the I VGA and the Q VGA to generate a single-ended combined signal at a desired phase;

means for steering current through a first I VGA and steering current through a second I VGA; and means for steering current through a first Q VGA and steering current through a second Q VGA.

12. The device of claim 11, wherein the means for steering current through the I VGA and the Q VGA comprises:

means for selecting a current flow through a primary side of a first EM element and means for selecting a current flow through a primary side of a second EM element to vary a phase of a signal at a secondary side of the first EM element and vary a phase of a signal at a secondary side of the second EM element.

13. The device of claim 11, wherein the RF receive signals comprise single-ended RF input signals provided to the I VGA and to the Q VGA and the I VGA and the Q VGA provide pseudo-differential outputs.

14. The device of claim 13, further comprising:

means for providing a pseudo-differential output of the I VGA to one of a positive terminal or a negative terminal of a primary side of the first EM element; and means for providing a pseudo-differential output of the Q VGA to one of a positive terminal or a negative terminal of a primary side of the second EM element.

15. The device of claim 11, wherein the RF receive signals comprise differential RF input signals provided to the I VGA and to the Q VGA and the I VGA and the Q VGA provide differential outputs.

16. The device of claim 15, further comprising:

means for providing the differential output of the I VGA to a negative terminal of the primary side of a first EM element; and means for providing the differential output of the Q VGA to a negative side of a primary terminal of a second EM element.

17. A communication system having a phase shifter, comprising:

a plurality of communication paths configured to carry a corresponding plurality of radio frequency (RF) communication signals;

a first of the plurality of communication paths having a first in phase variable gain amplifier (I VGA) and a first quadrature VGA (Q VGA);

a second of the plurality of communication paths having a second I VGA and a second Q VGA;

the first I VGA and the second I VGA coupled to a primary side of a first electromagnetic (EM) element, the first EM element configured to provide a single-ended I output;

the first Q VGA and the second Q VGA coupled to a primary side of a second EM element, the second EM element configured to provide a single-ended Q output; and a hybrid quadrature generator (HQG) configured to receive the single-ended I output of the first EM element and the single-ended Q output of the second EM element, the HQG configured to provide a combined signal.

18. The system of claim 17, wherein I VGA and the Q VGA of each of the plurality of communication paths are configured to provide selectable outputs to control a current flow through the primary side of the first EM element and the primary side of the second EM element.

19. The system of claim 17, wherein the I VGA and the Q VGA of each of the communication paths are configured to receive single-ended RF input signals and output pseudo-differential signals.

20. The system of claim 18, wherein each of the I VGA and the Q VGA of each of the plurality of communication paths are configured such that one of a positive terminal or a negative terminal of the primary side of the first EM element and one of a positive terminal or a negative terminal of the primary side of the second EM element receive an output of the I VGA and the Q VGA.

21. The system of claim 17, wherein the I VGA and the Q VGA of each of the plurality of communication paths are configured to receive a differential RF input signal, and wherein a positive terminal of the primary side of the first EM element and a positive terminal of the primary side of the second EM element is connected to system voltage and a negative terminal of the primary side of the first EM element receives an output of the I VGA of each of the plurality of communication paths and a negative terminal of the primary side of the second EM element receives an output of the Q VGA of each of the communication paths.

* * * * *